United States Patent
Tsunematsu et al.

(10) Patent No.: US 11,912,054 B2
(45) Date of Patent: Feb. 27, 2024

(54) LIGHT TO HEAT CONVERSION LAYER, DONOR SHEET USING LIGHT TO HEAT CONVERSION LAYER, AND METHOD FOR PRODUCING LIGHT TO HEAT CONVERSION LAYER

(71) Applicant: SUMITOMO METAL MINING CO., LTD., Tokyo (JP)

(72) Inventors: Hirofumi Tsunematsu, Isa (JP); Takeshi Chonan, Isa (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 644 days.

(21) Appl. No.: 16/647,600

(22) PCT Filed: Sep. 14, 2018

(86) PCT No.: PCT/JP2018/034176
§ 371 (c)(1),
(2) Date: May 27, 2020

(87) PCT Pub. No.: WO2019/054480
PCT Pub. Date: Mar. 21, 2019

(65) Prior Publication Data
US 2020/0307295 A1    Oct. 1, 2020

(30) Foreign Application Priority Data
Sep. 14, 2017   (JP) ................. 2017-176411

(51) Int. Cl.
*B41M 5/46* (2006.01)
(52) U.S. Cl.
CPC ......... *B41M 5/465* (2013.01); *B41M 2205/06* (2013.01)

(58) Field of Classification Search
CPC ..................................... B41M 5/465
See application file for complete search history.

(56) References Cited

U.S. PATENT DOCUMENTS 5,308,737 A    5/1994   Bills et al.
5,998,085 A   12/1999   Isberg et al.
(Continued)

FOREIGN PATENT DOCUMENTS

JP    2000-515083 A    11/2000
JP    2002-534782 A    10/2002
(Continued)

OTHER PUBLICATIONS

Dec. 18, 2018 Search Report issued in International Patent Application No. PCT/JP2018/034176.

*Primary Examiner* — Gerard Higgins
(74) *Attorney, Agent, or Firm* — Oliff PLC

(57) ABSTRACT

An LTHC layer having the visible light transmission property, having sufficient infrared absorption property, capable of improving transfer accuracy of the organic electroluminescence device by irradiation with a laser beam, and further enabling application in a wide variety of fields including electronics, medicine, agriculture, machine, etc. A donor sheet using the LTHC layer including infrared absorbing particles and a binder component, wherein the infrared absorbing particles are composite tungsten oxide fine particles including a hexagonal crystal structure, a lattice constant of the composite tungsten oxide fine particles is such that the a-axis is 7.3850 Å or more and 7.4186 Å or less, and the c-axis is 7.5600 Å or more and 7.6240 Å or less, and a particle size of the composite tungsten oxide fine particles is 100 nm or less, and the solar radiation transmittance is 45% or less.

13 Claims, 2 Drawing Sheets

(56) References Cited

U.S. PATENT DOCUMENTS

| | | |
|---|---|---|
| 6,114,088 A | 9/2000 | Wolk et al. |
| 2003/0053947 A1 | 3/2003 | Yaginuma et al. |
| 2004/0191564 A1 | 9/2004 | Kim et al. |
| 2005/0005732 A1 | 1/2005 | Yaginuma et al. |
| 2018/0016460 A1 | 1/2018 | Okada et al. |

FOREIGN PATENT DOCUMENTS

| | | |
|---|---|---|
| JP | 2003-206123 A | 7/2003 |
| JP | 2003-247001 A | 9/2003 |
| JP | 2004-200170 A | 7/2004 |
| JP | 3562830 B2 | 9/2004 |
| JP | 2016-9634 A | 1/2016 |
| JP | 2016-9635 A | 1/2016 |
| WO | 2016/121843 A1 | 8/2016 |
| WO | 2017/094909 A1 | 6/2017 |
| WO | 2017/159790 A1 | 9/2017 |
| WO | 2017/159791 A1 | 9/2017 |

LIGHT TO HEAT CONVERSION LAYER, DONOR SHEET USING LIGHT TO HEAT CONVERSION LAYER, AND METHOD FOR PRODUCING LIGHT TO HEAT CONVERSION LAYER

TECHNICAL FIELD

The present invention relates to a light to heat conversion layer (hereinafter referred to as "LTHC layer"), a donor sheet using the light to heat conversion layer, and a method for producing the light to heat conversion layer.

DESCRIPTION OF RELATED ART

A LTHC layer is a layer having a property that a part irradiated with an infrared radiation or near-infrared radiation generates heat whereas an unirradiated part does not generate heat. Therefore, since the LTHC layer can generate heat only at a desired site by irradiation with an infrared laser or near-infrared laser, it is expected to be applied to a wide variety of fields including electronics, medicine, agriculture, machine, and the like.

Regarding an urgent use, a use as a donor sheet is conceivable, which is used for producing an organic electroluminescence device in the field of electronics. Therefore, the LTHC layer will be described with the donor sheet taken as an example thereof.

As a method of forming an organic electroluminescence device on a substrate, a metal mask method, a laser transfer method, an ink-jet method and the like have been investigated. It is difficult for the metal mask method to respond to a larger planar size of the next-generation large-screen display devices, etc., and there still remain many technical problems in application of the inkjet method. Therefore, it is expected that the laser transfer method will be a mainstream for large-screen displays.

There are several laser transfer methods. Among them, a layer formation method which involves use of a film called a "donor sheet" is a mainstream. As a donor sheet, for example, a layer including a light absorbing layer called a LTHC layer and, for example, a layer of an organic compound having an electroluminescence property as a transfer layer, formed on a film base material, has been used. Although many methods are proposed for forming an organic electroluminescence device on a substrate by a laser transfer method, they have a common fundamental principle of operation. In other words, when a specified site of the LTHC layer is irradiated with a laser beam, the light is absorbed by the LTHC layer to generate heat which can transfer the organic electroluminescence device formed as a transferred layer.

A wide variety of materials are proposed for a light absorbing material for the LTHC layer as the donor sheet. For example, Patent Document 1 discloses organic and inorganic absorbing materials such as dyes absorbing a light in the infrared region and carbon black, metals, metal oxides, or metal sulfides, and other known pigments and absorbing materials. Patent Document 2 discloses dyes, pigments, metals, metal compounds, metal films and the like. Patent Document 3 discloses black aluminum. Patent Document 4 discloses carbon black, graphite, and infrared dyes.

As described above, when an organic electroluminescence device is formed, for example, by the laser transfer method, a desired site in the LTHC layer is irradiated with a laser beam, thereby the organic electroluminescence device contained in the donor sheet is transferred. However, for example, when the donor sheet includes a defect such as a foreign matter or uneven coating, an organic electroluminescence device at the site irradiated with a laser beam may fail to be normally transferred, resulting in generation of dots which are unlit after fabricated as a display device. Therefore, in order to obtain high yield, it is considered that a donor sheet including a defect is detected by visual observation or by using a visible light sensor or the like before the transfer by a laser beam.

However, when the materials proposed in Patent Documents 1 to 4 as the light absorbing materials to be applied to the LTHC layer are used, the visible light transmission property of the LTHC layer is not sufficient. In other words, when the light absorbing materials disclosed in Patent Documents 1 to 4 are used, the LTHC layer shows a very dark black color having substantially no light transmission property. Therefore, when such a LTHC layer is applied as the donor sheet, it is considered that defects cannot be detected by visual observation or by using a visible light sensor or the like.

Therefore, the applicants of the present invention disclosed in Patent Document 5 a LTHC layer having the visible light transmission property containing composite tungsten oxide fine particles which are near-infrared absorbing particles and a binder component, and a donor sheet using the LTHC layer.

PRIOR ART DOCUMENTS

Patent Documents

[Patent Document 1] Japanese Translation of PCT International Application Publication No. JP-T-2000-515083
[Patent Document 2] Japanese Translation of PCT International Application Publication No. JP-T-2002-534782
[Patent Document 3] Japanese Patent No. 3562830
[Patent Document 4] Japanese Patent Laid-Open Publication No. 2004-200170
[Patent Document 5] Japanese Patent Laid-Open Publication No. 2016-009634

SUMMARY OF THE INVENTION

Problems to be Solved by the Invention

As described above, since the applicants of the present invention disclose the LTHC layer having a visible light transmission property and the donor sheet using the LTHC layer, the defect can be detected by visual observation or by using a visible light sensor or the like.

However, with a recent technological innovation of organic electroluminescence devices, there has been an increased demand for high transfer accuracy of the organic electroluminescence device contained in the donor sheet by irradiation with a laser beam.

According to the investigation by the present inventors, it is found to be difficult to transfer the organic electroluminescence device with high accuracy by irradiation with a laser beam in a LTHC layer having the visible light transmission property containing composite tungsten oxide fine particles which are near-infrared absorbing particles and a binder component according to the related art and a donor sheet using the LTHC layer, disclosed in Patent Document 5.

The present invention has been attained under the above-described circumstances, and the problem to be solved is to provide a LTHC layer, having the visible light transmission property, having sufficient infrared absorption property, capable of improving the transfer accuracy of the organic electroluminescence device by irradiation with a laser beam, and enabling application in a wide variety of fields including electronics, medicine, agriculture, machine, etc.; a donor sheet using the LTHC layer; and a method for production thereof.

Means for Solving the Problems

In order to solve the above-described problems, the present inventors have studied. As a result, the present inventors found that, in a LTHC layer having the visible light transmission property, containing composite tungsten oxide fine particles which are near-infrared absorbing particles and a binder component, according to the related art, disclosed in Patent Document 5, there is a cloudiness (haze) resulting from the composite tungsten oxide fine particles dispersed in the binder component. It is desired that only the site irradiated with a light will become a heat generating site. However, irradiated laser beam is found to be scattered due to the haze, and therefore the accuracy of the heat generating site is reduced. As a result, the present inventors consider that improvement of the transfer accuracy of the organic electroluminescence device is inhibited.

Here, the present inventors have studied on a method for reducing haze resulting from the composite tungsten oxide fine particles dispersed in the binder component. Then, the present inventors conceived a constitution in which a crystal contained in the composite tungsten oxide fine particles that are infrared absorbing fine particles is a hexagonal crystal; the values of the a-axis and c-axis of its lattice constant are set such that the a-axis is 7.3850 Å or more and 7.4186 Å or less and the c-axis is 7.5600 Å or more and 7.6240 Å or less to enhance crystallinity; and a particle size of the fine particles is 100 nm or less.

The present inventors found that the composite tungsten oxide fine particles having the predetermined lattice constant are excellent in infrared absorption property and exhibit sufficient infrared absorption property even in a content less than that of the composite tungsten oxide fine particles according to the conventional art.

From the above-described findings, the present inventors found that haze can be reduced by decreasing the content of the composite tungsten oxide fine particles in the LTHC layer while the visible light transmission property and sufficient infrared absorption property are ensured, by using the composite tungsten oxide fine particles having the predetermined crystal structure. Then, the present inventors found that, in the LTHC layer containing the composite tungsten oxide fine particles having the predetermined crystal structures, only the site irradiated with an infrared radiation is to become a heat generating site with high accuracy, thereby generating heat.

In other words, the present inventors have found that the LTHC layer containing the composite tungsten oxide fine particles having the predetermined crystal structures enables application in a wide variety of fields including electronics, medicine, agriculture, machine, etc., and further realization of improved transfer accuracy of the organic electroluminescence device by using a donor sheet using the LTHC layer, and have attained the present invention.

Namely, a first invention to solve the above-described problem is a light to heat conversion layer including:
infrared absorbing particles and a binder component;
wherein the infrared absorbing particles are composite tungsten oxide fine particles including a hexagonal crystal structure,
a lattice constant of the composite tungsten oxide fine particles is such that the a-axis is 7.3850 Å or more and 7.4186 Å or less, and the c-axis is 7.5600 Å or more and 7.6240 Å or less, and
a particle size of the composite tungsten oxide fine particles is 100 nm or less.

A second invention is the light to heat conversion layer according to the first invention,
wherein the lattice constant of the composite tungsten oxide fine particles is such that the a-axis is 7.4031 Å or more and 7.4111 Å or less, and the c-axis is 7.5891 Å or more and 7.6240 Å or less.

A third invention is the light to heat conversion layer according to the first or second invention,
wherein the particle size of the composite tungsten oxide fine particles is 10 nm or more and 100 nm or less.

A fourth invention is the light to heat conversion layer according to any one of the first to third inventions,
wherein a crystallite size of the composite tungsten oxide fine particles is 10 nm or more and 100 nm or less.

A fifth invention is the light to heat conversion layer according to any one of the first to fourth inventions,
wherein the composite tungsten oxide fine particles are composite tungsten oxide fine particles represented by general formula $M_xW_yO_z$ (wherein M element is an element of one or more kinds selected from H, He, alkali metal, alkaline earth metal, rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, I, and Yb, W is tungsten, O is oxygen, satisfying $0.001 \leq x/y \leq 1$, $2.0 \leq z/y \leq 3.0$).

A sixth invention is the light to heat conversion layer according to the fifth invention,
wherein the M element is an element of one or more kinds selected from Cs and Rb.

A seventh invention is the light to heat conversion layer according to any one of the first to sixth inventions,
wherein at least a part of a surface of the composite tungsten oxide fine particle is covered with a surface covering layer containing at least one or more kinds of elements selected from Si, Ti, Zr, and Al.

An eighth invention is the light to heat conversion layer according to the seventh invention,
wherein the surface covering layer contains oxygen atoms.

A ninth invention is the light to heat conversion layer according to any one of the first to eighth inventions,
wherein the thickness of the light to heat conversion layer is 5 μm or less.

A tenth invention is the light to heat conversion layer according to any one of the first to ninth inventions,
which is a dried and cured ink coated on a base material and contains the infrared absorbing particles and the binder component.

An eleventh invention is a donor sheet, including:
the light to heat conversion layer according to any one of the first to tenth inventions,
a film base material, and
a transfer layer.

A twelfth invention is a method for producing a light to heat conversion layer including infrared absorbing particles and a binder component, wherein the infrared absorbing particles are composite tungsten oxide fine particles including a hexagonal crystal structure, the method including:

producing the composite tungsten oxide fine particles so that their lattice constant is in a range of 7.3850 Å or more and 7.4186 Å or less for the a-axis, and 7.5600 Å or more and 7.6240 Å or less for the c-axis; and performing a pulverization and dispersion step so that an average particle size is 100 nm or less while maintaining the range of the lattice constant in the composite tungsten oxide fine particles.

A thirteenth invention is the method for producing the light to heat conversion layer according to the twelfth invention, wherein the composite tungsten oxide fine particles are composite tungsten oxide fine particles represented by general formula $M_xW_yO_z$ (wherein M element is an element of one or more kinds selected from H, He, alkali metal, alkaline earth metal, rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, I, and Yb, W is tungsten, O is oxygen, satisfying $0.001 \leq x/y \leq 1$, $2.0 \leq z/y \leq 3.0$).

A fourteenth invention is the method for producing the light to heat conversion layer according to the thirteenth invention, wherein the M element is an element of one or more kinds selected from Cs and Rb.

A fifteenth invention is the method for producing the light to heat conversion layer according to any one of the twelfth to fourteenth inventions, wherein at least a part of a surface of the composite tungsten oxide fine particle is covered with a surface covering layer containing at least one or more kinds of elements selected from Si, Ti, Zr, and Al.

A sixteenth invention is the method for producing the light to heat conversion layer according to the fifteenth invention, wherein the surface covering layer contains oxygen atoms.

A seventeenth invention is the method for producing the light to heat conversion layer according to any one of the twelfth to sixteenth inventions, wherein the thickness of the light to heat conversion layer is 5 μm or less.

Advantage of the Invention

The LTHC layer according to the present invention, in which only the site irradiated with infrared radiation becomes a heat generating site and thereby generates heat, enables application in a wide variety of fields including electronics, medicine, agriculture, machine, etc. The transfer accuracy of the organic electroluminescence device can be improved by using a donor sheet using the LTHC layer.

DETAILED DESCRIPTION OF THE INVENTION

Embodiments for carrying out the present invention will be hereinafter described with reference to the drawings. However, the present invention is not limited to the following embodiments, and various modifications and substitutions can be made to the following embodiments without departing from the scope of the present invention.

The LTHC layer according to the present invention is a LTHC layer containing composite tungsten oxide fine particles having a predetermined constitution as an infrared absorbing component.

Figure 3:
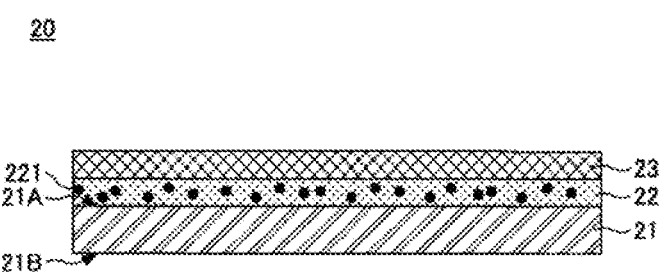
FIG. 3 is an explanatory diagram of a cross-sectional constitution example of a donor sheet.

Further, the donor sheet according to the present invention has a structure, for example, in which a LTHC layer 22 containing infrared absorbing particles 221 and a transfer layer 23 are stacked on one surface 21A of a film base material 21, as illustrated in FIG. 3 which is a cross-sectional constitution example of the donor sheet. Therefore, the constitution of the donor sheet according to the present invention will be described in the following order: [1] Composite tungsten oxide fine particles, [2] LTHC layer, [3] Film base material, [4] Transfer layer, and [5] Donor sheet.

[1] Composite Tungsten Oxide Fine Particles

The composite tungsten oxide fine particles according to the present invention and the composite tungsten oxide fine particle dispersion liquid used for producing a LTHC layer described below containing the composite tungsten oxide fine particles will be described in the following order: [a] Characteristics of composite tungsten oxide fine particles, [b] Method for synthesizing composite tungsten oxide fine particles, [c] Composite tungsten oxide fine particle dispersion liquid, and [d] Drying treatment method of composite tungsten oxide fine particle dispersion liquid.

[A] Characteristics of Composite Tungsten Oxide Fine Particles

Figure 2:
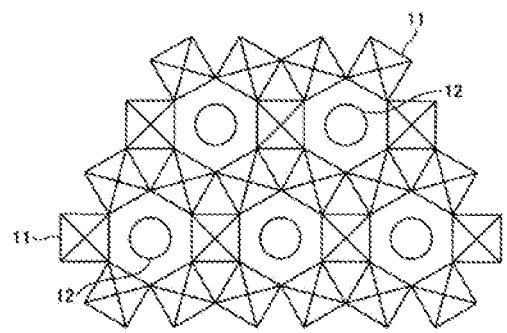
FIG. 2 is a schematic diagram illustrating a crystal structure of a composite tungsten oxide having hexagonal crystal.

The composite tungsten oxide fine particles according to the present invention have infrared absorption properties and includes a hexagonal crystal structure as illustrated in FIG. 2, and the lattice constant of the hexagonal composite tungsten oxide fine particles is such that the a-axis is 7.3850 Å or more and 7.4186 Å or less and the c-axis is 7.5600 Å or more and 7.6240 Å or less. In addition, the composite tungsten oxide fine particles have a particle size of 100 nm or less. Further, the value of the ratio of (c-axis lattice constant/a-axis lattice constant) is preferably 1.0221 or more and 1.0289 or less.

The composite tungsten oxide fine particles according to the present invention will be hereinafter described in the following order: (1) Crystal structure and lattice constant, (2) Particle size and crystallite size, (3) Composition of composite tungsten oxide fine particles, (4) Surface covering layer of composite tungsten oxide fine particles, and (5) Summary.

(1) Crystal Structure and Lattice Constant

The composite tungsten oxide fine particles according to the present invention may take a tetragonal or cubic tungsten bronze structure other than hexagonal structure, and they are effective in any of these structure as infrared absorbing materials. However, the absorption site in the infrared region tends to vary depending on the crystal structure of the composite tungsten oxide fine particles. That is, in the infrared region, the absorption site of a cubic crystal tends to shift toward the longer wavelength side compared to that of a tetragonal crystal, and the absorption site of a hexagonal crystal tends to shift toward the further longer wavelength side compared to that of the cubic crystal. Corresponding to the variation of the absorption site, the hexagonal crystal absorbs the least light in the visible light region, followed by the tetragonal crystal, and the cubic crystal absorbs the most among them.

From the findings described above, for applications in which light in the visible light region is more transmitted and light in the infrared region is more absorbed, it is most preferable to use the hexagonal tungsten bronze. When each composite tungsten oxide fine particles has a hexagonal crystal structure, transmittance of the fine particles in the visible light region is improved and absorption in the near-infrared region is improved. In this hexagonal crystal structure, a hexagonal void (tunnel) is formed by assembling six octahedrons formed by $WO_6$ units. Then, the M element is arranged in the void to constitute one unit, and a large number of these units gather to form a hexagonal crystal structure.

According to the present invention, in order to improve the transmission in the visible light region and to improve the absorption in the near-infrared region, it is sufficient that the unit structure 11 (a structure in which hexagonal voids are formed by assembling six octahedrons formed by $WO_6$ units and M elements 12 are arranged in the voids) as illustrated in FIG. 2 is contained in the composite tungsten oxide fine particles.

When the cation of the M element is added and present in the hexagonal void, the absorption in the infrared region is improved. Generally, when the M element having a large ion radius is added, the hexagonal crystal is formed. Specifically, when one or more kinds selected from Cs, Rb, K, Tl, Ba, and In are added, the hexagonal crystal is easily formed, which is preferable.

Further, in the composite tungsten oxide fine particles to which one or more kinds selected from Cs and Rb are added among the M elements having a large ion radius, both absorption in the infrared region and transmission in the visible light region can be achieved. Also, in the case where, as the M element, two or more kinds are selected, one of them being selected from Cs, Rb, K, Tl, Ba, and In while others being selected from one or more elements constituting the M element, a hexagonal crystal may be obtained in some cases.

In the case of Cs tungsten oxide fine particles in which Cs is selected as the M element, the lattice constant thereof is preferably such that the a-axis is 7.4031 Å or more and 7.4186 Å or less and the c-axis is 7.5750 Å or more and 7.6240 Å or less, and more preferably the a-axis is 7.4031 Å or more and 7.4111 Å or less and the c-axis is 7.5891 Å or more and 7.6240 Å or less.

In the case of Rb tungsten oxide fine particles in which Rb is selected as the M element, it is preferable that the lattice constant thereof is such that the a-axis is 7.3850 Å or more and 7.3950 Å or less and the c-axis is 7.5600 Å or more and 7.5700 Å or less.

In the case of CsRb tungsten oxide fine particles in which Cs and Rb are selected as the M elements, it is preferable that the lattice constant thereof is such that the a-axis is 7.3850 Å or more and 7.4186 Å or less and the c-axis is 7.5600 Å or more and 7.6240 Å or less.

Incidentally, the M element is not limited to the above Cs and Rb. As the M element, even an element other than Cs or Rb is acceptable so long as it is present as the M element added in the hexagonal void formed by the $WO_6$ units.

In the case where the composite tungsten oxide fine particles having the hexagonal crystal structure according to the present invention is represented by general formula $M_xW_yO_z$, when the composite tungsten oxide fine particles have a uniform crystal structure, the addition amount of the M element is $0.001 \leq x/y \leq 1$, preferably $0.2 \leq x/y \leq 0.5$, more preferably $0.20 \leq x/y \leq 0.37$, and most preferably $x/y=0.33$. This is because theoretically, when satisfying $z/y=3$, $x/y=0.33$ is established, and the added M element is considered to be arranged in all hexagonal voids. Typical examples include $Cs_{0.33}WO_3$, $Cs_{0.03}Rb_{0.30}WO_3$, $Rb_{0.33}WO_3$, $K_{0.33}WO_3$, $Ba_{0.33}WO_3$ and the like.

Here, the present inventors have studied on a measure of further improving the infrared absorption function of the composite tungsten oxide fine particles, and have achieved a configuration in which the amount of the contained free electrons is further increased.

Namely, as a measure to increase the amount of the free electrons, the inventors have achieved a measure in which a mechanical treatment is applied to the composite tungsten oxide fine particles to give appropriate strain and deformation to the contained hexagonal crystals. In the hexagonal crystal to which the appropriate strain and deformation are given, it is considered that the amount of the free electrons increases due to a change in an overlapping state of electron orbitals in the atoms constituting the crystallite structure.

Therefore, the inventors have studied based on the above-described findings as follows: in a dispersion step when producing the composite tungsten oxide fine particle dispersion liquid from the particles of the composite tungsten oxide produced by a firing step of [b] Method for synthesizing composite tungsten oxide fine particles described below, the particles of the composite tungsten oxide are pulverized under predetermined conditions, thereby giving strain and deformation to the crystal structure and increasing the amount of the free electrons, to further improve the infrared absorption function, that is, the light to heat conversion function of the composite tungsten oxide fine particles.

From the above study, the inventors have paid attention to each particle of the composite tungsten oxide produced through the firing step. Then, it is found that there are variations in both the lattice constant and a constituent element composition among the particles.

As a result of further study, it is found that in the final composite tungsten oxide fine particles, desired optical properties are exhibited irrespective of the variations in the lattice constant and the constituent element composition among the fine particles as long as the lattice constant falls within a predetermined range.

The present inventors who have obtained the above-described findings have further studied regarding the optical properties exhibited by the composite tungsten oxide fine particles, while grasping a degree of the strain and the deformation of the crystal structure of the fine particles by measuring the a-axis and the c-axis which are lattice constants in the crystal structure of the fine particles.

Then, as a result of the above study, it is found that, when the a-axis is 7.3850 Å or more and 7.4186 Å or less and the c-axis is 7.5600 Å or more and 7.6240 Å or less in the hexagonal composite tungsten oxide fine particles, the fine particles exhibit the transmittance having a local maximum value in a wavelength range from 350 nm to 600 nm and a local minimum value in a wavelength range from 800 nm to 2100 nm, and are the infrared absorbing material fine particles exhibiting excellent infrared absorbing effect.

Further, it is also found that in the hexagonal composite tungsten oxide fine particles in which the composite tungsten oxide fine particles according to the present invention have the lattice constant such that the a-axis is 7.3850 Å or more and 7.4186 Å or less and the c-axis is 7.5600 Å or more and 7.6240 Å or less, particularly excellent infrared absorption effect is exhibited when the value of x/y indicating the addition amount of the M element is in the range of $0.20 \leq x/y \leq 0.37$.

Further, it is also found that, in the composite tungsten oxide fine particles as the infrared absorbing material fine particles, a single crystal whose amorphous phase volume ratio is 50% or less is preferable. This is considered because when the composite tungsten oxide fine particles are single crystals having the amorphous phase volume ratio of 50% or less, the crystallite size can be 10 nm or more and 100 nm or less while maintaining the lattice constant within the above-described predetermined range and excellent optical properties can be exhibited.

The fact that the composite tungsten oxide fine particles are single crystals can be confirmed from an electron microscope image by transmission electron microscope in which no grain boundaries are observed inside each fine particle, and only uniform lattice fringes are observed. The fact that the amorphous phase volume ratio is 50% or less in the composite tungsten oxide fine particles can be confirmed from the electron microscope image by transmission electron microscope in which uniform lattice fringes are observed throughout the fine particles and there are almost no unclear portions.

Further, since the amorphous phase exists on the outer periphery of the fine particles in many cases, the amorphous phase volume ratio can be calculated by paying attention to the outer periphery of the fine particles in many cases. For example, in a spherical composite tungsten oxide fine particle, when the amorphous phase with unclear lattice fringes exists in a layered manner on the outer periphery of the fine particles, the amorphous phase volume ratio in the composite tungsten oxide fine particles is 50% or less, as long as the thickness of the layer is 10% or less of the particle size.

On the other hand, when the composite tungsten oxide fine particles are dispersed in a matrix of a solid medium such as a resin constituting the LTHC layer which is the composite tungsten oxide fine particles dispersion body, the composite tungsten oxide fine particles can be considered as a single crystal having the amorphous phase volume ratio of 50% or less, as long as the value obtained by subtracting the crystallite size from the average particle size of the dispersed composite tungsten oxide fine particles is 20% or less of the average particle size.

As described above, it is preferable that synthesis, pulverization, and dispersion of the composite tungsten oxide fine particles may be suitably adjusted depending on the production equipment so that the value obtained by subtracting the crystallite size from the average particle size of the composite tungsten oxide fine particles dispersed in the LTHC layer is 20% or less of the average particle size.

The measurement of the crystal structure and the lattice constant of the composite tungsten oxide fine particles is performed on the composite tungsten oxide fine particles obtained after removal of a solvent from the composite tungsten oxide fine particle dispersion liquid described below, and the crystal structure contained in the fine particle is identified using the X-ray diffraction method, and the a-axis length and c-axis length can be calculated as lattice constants using the Rietveld method.

(2) Particle Size and Crystallite Size

The composite tungsten oxide fine particles have a particle size of 100 nm or less. From a viewpoint of exhibiting more excellent infrared absorption properties, the particle size is preferably 10 nm or more and 100 nm or less, more preferably 10 nm or more and 80 nm or less, and further preferably 10 nm or more and 60 nm or less. When the particle size is in the range of 10 nm or more and 60 nm or less, the most excellent infrared absorption properties are exhibited.

Here, the particle size is a value of a diameter of an individual composite tungsten oxide fine particle not aggregated, and is a particle size of the composite tungsten oxide fine particles contained in the LTHC layer described below.

On the other hand, the particle size does not include the size of the aggregate of the composite tungsten oxide fine particles, and is different from the dispersed particle size.

The average particle size is calculated from an electron microscope image of the LTHC layer described below.

The average particle size of the composite tungsten oxide fine particles contained in the LTHC layer can be obtained from a transmission electron microscope image of thinned samples of the LTHC layer taken out by cross-section processing by measuring the particle size of 100 composite tungsten oxide fine particles using an image processing device, and calculating the average value. At this time, in the case where the composite tungsten oxide fine particles form an aggregate, the particle size is measured for each single particle constituting the aggregate. Therefore, the diameter of the aggregate is not included.

A microtome, a cross section polisher, a focused ion beam (FIB) apparatus, or the like can be used for cross-section processing for taking out the thinned samples. The average particle size of the composite tungsten oxide fine particles contained in the LTHC layer is the average value of the particle sizes of the composite tungsten oxide fine particles dispersed in a solid medium which is a matrix.

In addition, from a viewpoint of exhibiting more excellent infrared absorption properties, the crystallite size of the composite tungsten oxide fine particles is preferably 10 nm or more and 100 nm or less, more preferably 10 nm or more and 80 nm or less, and further preferably 10 nm or more and 60 nm or less. It is because when the crystallite size is in the range of 10 nm or more and 60 nm or less, the most excellent infrared absorption properties are exhibited.

The lattice constant, crystallite size, and particle size of the composite tungsten oxide fine particles contained in the composite tungsten oxide fine particle dispersion liquid obtained after disintegration treatment, pulverization treatment, or dispersion treatment described later are maintained in the composite tungsten oxide fine particles obtained by removing volatile components from the composite tungsten oxide fine particle dispersion liquid and maintained in the composite tungsten oxide fine particles contained in the LTHC layer obtained from the composite tungsten oxide fine particle dispersion liquid as well.

As a result, the effect of the present invention is also exhibited in the composite tungsten oxide fine particle dispersion liquids according to the present invention and the LTHC layer containing the composite tungsten oxide fine particles according to the present invention.

(3) Composition of Composite Tungsten Oxide Fine Particles

The composite tungsten oxide fine particles of the present invention are preferably represented by general formula $M_xW_yO_z$ (wherein, M is an element of one or more kinds selected from H, He, alkali metal, alkaline earth metal, rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, I, and Yb, W is tungsten, O is oxygen, satisfying $0.001 \leq x/y \leq 1$, $2.0 \leq z/y \leq 3.0$).

The composite tungsten oxide fine particles represented by the general formula $M_xW_yO_z$ will be described.

The M element, x, y, z and the crystal structure of the general formula $M_xW_yO_z$ are closely related to the free electron density of the composite tungsten oxide fine particles, and have a significant effect on infrared absorption properties.

Generally, tungsten trioxide ($WO_3$) has low infrared absorption properties because effective free electrons do not exist therein.

Here, the present inventors found that by adding to the tungsten oxide the M element (wherein, the M element is an element of one or more kinds selected from H, He, alkali metal, alkaline earth metal, rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, I, and Yb) to obtain the composite tungsten oxide, the free electrons are generated in the composite tungsten oxide, and the absorption property derived from the free electrons appears in the infrared region and therefore the composite tungsten oxide is also effective as an infrared absorbing material in the vicinity of 1000 nm in wavelength, and the composite tungsten oxide maintains a chemically stable state, and therefore is effective as an infrared absorbing material with excellent weather resistance. Further, the M element is preferably Cs, Rb, K, Tl, Ba, or In. Among them, in the case of Cs or Rb as the M element, the composite tungsten oxide easily has a hexagonal structure. As a result, it is also found that the visible light is transmitted and the infrared radiation is absorbed, which is particularly preferable for the reasons described below. Also, in the case where, as the M element, two or more kinds are selected, one of them being selected from Cs, Rb, K, Tl, Ba, and In while others being selected from one or more elements constituting the M element, a hexagonal crystal may be obtained.

Here, the findings of the present inventors regarding the value of x indicating an addition amount of the M element will be described.

When the value of x/y is 0.001 or more, a sufficient amount of free electrons is generated, and a desired infrared absorption property can be obtained. Then, as the addition amount of the M element increases, the supply amount of the free electrons increases and the infrared absorption properties also increase, but the effect is saturated when the value of x/y is about 1. Further, when the value of x/y is 1 or less, generation of an impurity phase in the composite tungsten fine particles can be avoided, which is preferable.

Next, the findings of the present inventors regarding the value of z indicating the control of an oxygen amount will be described.

In the composite tungsten oxide fine particles represented by general formula $M_xW_yO_z$, the value of z/y is preferably $2.0 \leq z/y \leq 3.0$, more preferably $2.2 \leq z/y \leq 3.0$, further preferably, $2.6 \leq z/y \leq 3.0$, and most preferably, $2.7 \leq z/y \leq 3.0$. It is because when the value of z/y is 2.0 or more, it is possible to avoid the appearance of a $WO_2$ crystal phase other than the intended one in the composite tungsten oxide, and to obtain the chemical stability as a material so that it is applicable as an effective infrared absorbing material. On the other hand, when the value of z/y is 3.0 or less, a required amount of free electrons is generated in the tungsten oxide to provide an efficient infrared absorbing material.

(4) Surface Covering Layer of Composite Tungsten Oxide Fine Particles

In order to improve the weather resistance of the composite tungsten oxide fine particles, it is preferable to cover at least a part of the surface of the composite tungsten oxide fine particles with a surface covering layer containing one or more kinds of elements selected from silicon, zirconium, titanium, and aluminum. Since the surface covering layer is basically transparent, addition of the layer never reduces visible light transmittance. The covering method is not particularly limited, but the surface of the composite tungsten oxide fine particle can be covered by adding a metal alkoxide containing the above-described element to a solution in which the composite tungsten oxide fine particles are dispersed. In this case, the surface covering layer contains oxygen atoms, and the surface covering layer is more preferably constituted by an oxide.

(5) Summary

As described in detail above, the lattice constant, particle size, and crystallite size of the composite tungsten oxide fine particles can be controlled by predetermined production conditions. Specifically, in the thermal plasma method, the solid-phase reaction method or the like described later, they can be controlled by appropriate setting of the production conditions such as a temperature at which the fine particles are generated (firing temperature), a generation time (firing time), a generation atmosphere (firing atmosphere), a form of a precursor raw material, an annealing treatment after generation, doping with an impurity element, and the like.

[b] Method for Synthesizing Composite Tungsten Oxide Fine Particles

A method for synthesizing the composite tungsten oxide fine particles according to the present invention will be described.

Examples of the method for synthesizing the composite tungsten oxide fine particles according to the present invention include a thermal plasma method for injecting a tungsten compound starting material into thermal plasma, and a solid-phase reaction method for applying heat treatment to the tungsten compound starting material in a reducing gas atmosphere. The composite tungsten oxide fine particles synthesized by the thermal plasma method or the solid-phase reaction method are subjected to a dispersion treatment or a pulverization and dispersion treatment.

Explanation will be given hereafter in the following order: (1) Thermal plasma method, (2) Solid-phase reaction method, and (3) Synthesized composite tungsten oxide fine particles.

(1) Thermal Plasma Method

Explanation will be given for the thermal plasma method in the following order: (i) Raw material used for thermal plasma method, (ii) Thermal plasma method and its conditions.

(i) Raw Material Used for Thermal Plasma Method

When synthesizing the composite tungsten oxide fine particles by the thermal plasma method, a mixed powder of the tungsten compound and the M element compound can be used as raw materials.

The tungsten compound is preferably one or more kinds selected from tungstic acid ($H_2WO_4$), ammonium tungstate, tungsten hexachloride, and tungsten hydrate obtained by adding water to tungsten hexachloride dissolved in alcohol for hydrolysis followed by evaporation of the solvent.

Further, as the M element compound, it is preferable to use at least one kind of element selected from oxides, hydroxides, nitrates, sulfates, chlorides and carbonates of the M element.

The above-described tungsten compound and the aqueous solution containing the above-described M element compound are wet-mixed so that the ratio of the M element to the W element is equal to the ratio of the M element to the W element of MxWyOz (wherein M is the M element, W is tungsten, O is oxygen, satisfying $0.001 \leq x/y \leq 1.0$, $2.0 \leq z/y \leq 3.0$). Then, by drying the obtained mixture liquid, a mixed powder of the M element compound and the tungsten compound is obtained. The mixed powder can be used as a raw material for the thermal plasma method.

Further, the composite tungsten oxide obtained by first firing of the mixed powder in an inert gas alone or in a mixed gas atmosphere of the inert gas and a reducing gas, can also be used as a raw material for the thermal plasma method. Besides, the composite tungsten oxide obtained by two stage firing such as first firing of the mixed powder in the mixed gas atmosphere of the inert gas and the reducing gas, and a second firing of the first fired material in the inert gas atmosphere, can also be used as the raw material for the thermal plasma method.

(ii) Thermal Plasma Method and its Conditions

As the thermal plasma used in the present invention, for example, any one of direct current arc plasma, high-frequency plasma, microwave plasma, low frequency alternating current plasma, or superimposed plasma of them, or plasma generated by an electric method of applying a magnetic field to direct current plasma, plasma generated by irradiation with a high power laser, and plasma generated by high power electron beam or ion beam, can be used. However, regardless of which thermal plasma is used, it is preferable to use thermal plasma having a high temperature part of 10000 to 15000 K, and particularly to use plasma capable of controlling the time for generating the fine particles.

The raw material fed into the thermal plasma having the high temperature part is evaporated instantaneously in the high temperature part. Then, the evaporated raw material is condensed in the course of reaching a plasma tail flame part, and is rapidly cooled and solidified outside of the plasma flame, thereby producing the composite tungsten oxide fine particles.

Figure 1:
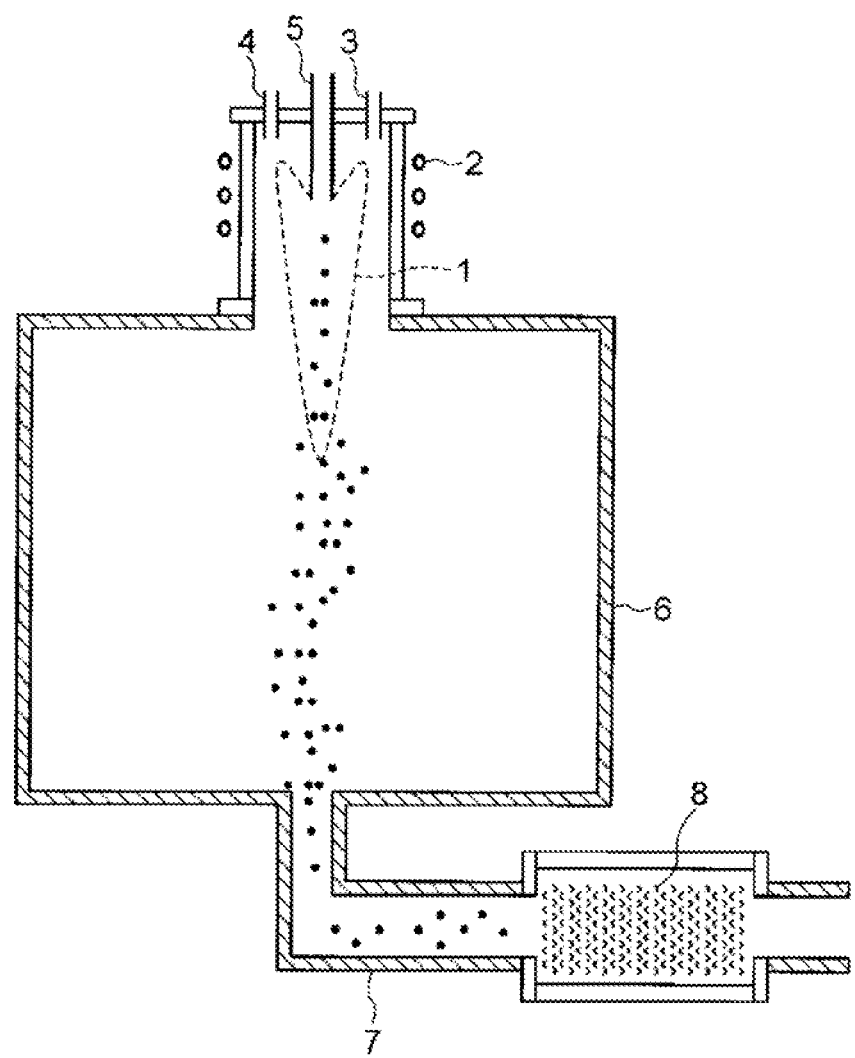
FIG. 1 is a conceptual diagram of a high-frequency plasma reactor used in the present invention.

A synthesis method will be described with reference to FIG. 1 taking a case of using a high-frequency plasma reaction device as an example.

First, an inside of a reaction system constituted by an inside of a water-cooled quartz double tube and an inside of a reaction vessel 6 is evacuated to about 0.1 Pa (about 0.001 Torr) by a vacuum exhaust device. After evacuating the inside of the reaction system, the inside of the reaction system in turn is filled with argon gas to make an argon gas flow system of 1 atm.

Thereafter, any gas selected from argon gas, mixed gas of argon and helium (Ar—He mixed gas), or mixed gas of argon and nitrogen (Ar—N₂ mixed gas) is introduced into the reaction vessel as a plasma gas from the plasma gas feeding nozzle 4 at a flow rate of 30 to 45 L/min. On the other hand, Ar—He mixed gas is introduced from the sheath gas feeding nozzle 3 at a flow rate of 60 to 70 L/min as the sheath gas to be flowed to immediately outside of the plasma region.

Then, an alternating current is applied to the high-frequency coil 2 to generate thermal plasma 1 by a high-frequency electromagnetic field (frequency 4 MHz). At this time, high-frequency power is set to 30 to 40 kW.

Further, the mixed powder of the M element compound and the tungsten compound obtained by the above-described synthesis method, or the composite tungsten oxide is introduced from a powder feeding nozzle 5 into the thermal plasma at a feed rate of 25 to 50 g/min, using 6 to 98 L/min of argon gas fed from the gas feeding device as a carrier gas, and a reaction is caused for a predetermined time. After the reaction, the generated composite tungsten oxide fine particles pass through a suction tube 7 and become deposited on a filter 8, and therefore the deposited fine particles are collected.

The carrier gas flow rate and the raw material feed rate greatly affect the generation time of the fine particles. Therefore, it is preferable that the carrier gas flow rate is set to 6 L/min or more and 9 L/min or less and the raw material feed rate is set to 25 to 50 g/min.

Further, the plasma gas flow rate is preferably 30 L/min or more and 45 L/min or less, and a sheath gas flow rate is preferably 60 L/min or more and 70 L/min or less. The plasma gas has a function of keeping a thermal plasma region having a high temperature part of 10000 to 15000 K, and the sheath gas has a function of cooling an inner wall surface of a quartz torch in the reaction vessel and preventing melting of the quartz torch. At the same time, the plasma gas and the sheath gas affect the shape of the plasma region, and therefore these gas flow rates are important parameters for shape control of the plasma region. As the plasma gas flow rate and the sheath gas flow rate are increased, the shape of the plasma region extends in a gas flow direction, and a temperature gradient of the plasma tail flame part becomes gentle, and therefore it becomes possible to lengthen the generation time of the fine particles to be produced and to produce the fine particles with good crystallinity.

When the composite tungsten oxide obtained by synthesis using the thermal plasma method has a crystallite size exceeding 100 nm, or when the dispersed particle size of the composite tungsten oxide in the composite tungsten oxide fine particle dispersion liquid obtained from the composite tungsten oxide obtained by synthesis using the thermal plasma method exceeds 200 nm, the pulverization and dispersion treatment described later can be performed. When the composite tungsten oxide is synthesized by the thermal plasma method, the effect of the present invention is exhibited by appropriately selecting the plasma conditions and the conditions for the subsequent pulverization and dispersion treatment to determine the pulverization conditions (conditions for forming fine particles) for providing the particle size, the crystallite size, and a-axis length and c-axis length as the lattice constants of the obtained composite tungsten oxide.

(2) Solid-Phase Reaction Method

The solid-phase reaction method will be described in the following order: (i) Raw material used in solid-phase reaction method, and (ii) Firing in solid-phase reaction method and its conditions.

(i) Raw Material Used in Solid-Phase Reaction Method

When the composite tungsten oxide fine particles according to the present invention is synthesized by the solid-phase reaction method, a tungsten compound and an M element compound are used as the raw material.

The tungsten compound is preferably one or more kinds selected from tungstic acid ($H_2WO_4$), ammonium tungstate, tungsten hexachloride, and tungsten hydrate obtained by adding water to the tungsten hexachloride dissolved in alcohol for hydrolysis followed by evaporation of the solvent.

Further, the M element compound used for producing the raw material of the composite tungsten oxide fine particles represented by general formula MxWyOz (wherein M is an element of one or more kinds selected from Cs, Rb, K, Tl, Ba, and In, satisfying $0.001 \leq x/y \leq 1$, $2.0 \leq z/y \leq 3.0$) which is a more preferable embodiment, is preferably one or more kinds selected from oxides, hydroxides, nitrates, sulfates, chlorides, carbonates of the M element.

Further, a compound containing an impurity element of one or more kinds selected from Si, Al, and Zr (sometimes referred to as "impurity element compound" in the present invention) may be contained as a raw material. The impurity element compound does not react with the composite tungsten compound in a subsequent firing step, and works to suppress a crystal growth of the composite tungsten oxide and prevent coarsening of the crystal. The compound containing the impurity element is preferably one or more kinds selected from oxides, hydroxides, nitrates, sulfates, chlorides, and carbonates, and colloidal silica and colloidal alumina having a particle size of 500 nm or less are particularly preferable.

The above-described tungsten compound and the aqueous solution containing the above-described M element compound are wet-mixed so that the ratio of the M element to the W element is equal to the ratio of the M element to the W element of $M_xW_yO_z$ (wherein M is the M element, W is tungsten, O is oxygen, satisfying $0.001 \leq x/y \leq 1.0$, $2.0 \leq z/y \leq 3.0$). When the impurity element compound is contained as a raw material, the impurity element compound is wet-mixed so as to be 0.5 mass % or less. Then, by drying the obtained mixed solution, the mixed powder of the M element compound and the tungsten compound, or the mixed powder of the M element compound containing the impurity element compound and the tungsten compound can be obtained.

(ii) Firing in Solid-Phase Reaction Method and its Conditions

One-stage firing is performed to the mixed powder of the M element compound and the tungsten compound produced by the wet-mixing, or the mixed powder of the M element compound containing the impurity element compound and the tungsten compound, in an inert gas alone or a mixed gas atmosphere of the inert gas and reducing gas. The firing temperature is preferably close to a temperature at which the composite tungsten oxide fine particles start to crystallize. Specifically, the firing temperature is preferably 1000° C. or less, more preferably 800° C. or less. The temperature range of 800° C. or less and 500° C. or more is still more preferable.

The reducing gas is not particularly limited, but is preferably $H_2$. Further, when $H_2$ is used as the reducing gas, its concentration is not particularly limited and is appropriately selected according to a firing temperature and an amount of the starting material. For example, the concentration is 20 vol % or less, preferably 10 vol % or less, and more preferably 7 vol % or less. This is because when the concentration of the reducing gas is 20 vol % or less, it is possible to avoid the generation of $WO_2$ not having a solar radiation absorption function by rapid reduction. At this time, by controlling the firing condition, the particle size, the crystallite size, and the a-axis length and the c-axis length of the lattice constant of the composite tungsten oxide fine particles according to the present invention can be set to the predetermined values.

In synthesizing the composite tungsten oxide fine particles, tungsten trioxide may be used instead of the tungsten compound.

(3) Synthesized Composite Tungsten Oxide Fine Particles

When the composite tungsten oxide fine particle dispersion liquid described later are prepared by using the composite tungsten oxide fine particles obtained by the synthesis method using the thermal plasma method or the solid-phase reaction method, the dispersed particle size of the fine particles contained in the dispersion liquid exceeds 200 nm in some cases. In such a case, the pulverization and dispersion treatment may be performed to the composite tungsten oxide fine particles in the step of producing the composite tungsten oxide fine particle dispersion liquid described later. Then, if the values of the particle size, the crystallite size, and the a-axis length and the c-axis length of the lattice constant of the composite tungsten oxide fine particles obtained through the pulverization and dispersion treatment are within a range of the present invention, the LTHC layer obtained from the composite tungsten oxide fine particles and the dispersion liquid thereof according to the present invention can exhibit excellent infrared absorption properties.

As described above, the composite tungsten oxide fine particles according to the present invention have a particle size of 100 nm or less. However, in the case where the particle size of the composite tungsten oxide fine particles obtained by the method illustrated in "[b] Method for synthesizing composite tungsten oxide fine particles" exceeds 100 nm, they are pulverized and dispersed to obtain finer particles, and the composite tungsten oxide fine particle dispersion liquid is produced (pulverization and dispersion treatment step) and the composite tungsten oxide fine particle dispersion liquid thus produced is subjected to drying treatment to remove the volatile components (mostly solvent). Thus, the composite tungsten oxide fine particles according to the present invention can be produced.

[c] Composite Tungsten Oxide Fine Particle Dispersion Liquid

The composite tungsten oxide fine particle dispersion liquid used for producing the below-described LTHC layer containing the composite tungsten oxide fine particles obtained in the above-described steps will be described.

The composite tungsten oxide fine particle dispersion liquid is obtained by pulverizing and dispersing the composite tungsten oxide fine particles obtained by the above synthesis method, a liquid medium for a mixed slurry selected from water, organic solvent, liquid resin, liquid plasticizer for plastics, polymer monomer, or a mixture thereof, and appropriate amounts of dispersant, a coupling agent, a surfactant, etc., using a medium stirring mill.

The above composite tungsten oxide fine particle dispersion liquid is characterized in that a dispersion state of the fine particles in the solvent is good, and the dispersed particle size is 1 to 200 nm. Further, it is preferable that the content of the composite tungsten oxide fine particles contained in the composite tungsten oxide fine particle dispersion liquid is 0.01 mass % or more and 80 mass % or less.

Hereinafter, the composite tungsten oxide fine particle dispersion liquid according to the present invention will be described in the following order: (1) Solvent to be used, (2) Dispersant to be used, (3) Pulverization and dispersion method, (4) Dispersed particle size in tungsten oxide fine particle dispersion liquid, (5) Binder and other additives.

(1) Solvent to be Used

A liquid solvent used for the composite tungsten oxide fine particle dispersion liquid is not particularly limited, and may be selected suitably according to a coating condition and a coating environment of the composite tungsten oxide fine particle dispersion liquid, and an inorganic binder and resin binder appropriately added thereto. For example, the liquid solvent is water, an organic solvent, an oil and fat, a liquid resin, a liquid plasticizer for a medium resin, a polymer monomer, or a mixture thereof.

Here, as the organic solvent, various solvents such as alcoholic solvents, ketone-based solvents, hydrocarbon-based solvents, glycol-based solvents, and aqueous solvent can be selected. Specifically, alcoholic solvents such as methanol, ethanol, 1-propanol, isopropanol, butanol, pentanol, benzyl alcohol, diacetone alcohol; ketone-based solvents such as acetone, methyl ethyl ketone, methyl propyl ketone, methyl isobutyl ketone, cyclohexanone, isophorone; ester-based solvents such as 3-methyl-methoxy-propionate; glycol derivatives such as ethylene glycol monomethyl ether, ethylene glycol monoethyl ether, ethylene glycol isopropyl ether, propylene glycol monomethyl ether, propylene glycol monoethyl ether, propylene glycol methyl ether acetate, propylene glycol ethyl ether acetate; amides such as formamide, N-methylformamide, dimethylformamide, dimethylacetamide, N-methyl-2-pyrrolidone; aromatic hydrocarbons such as toluene and xylene; ethylene chloride, chlorobenzene, etc., can be used. Among these organic solvents, dimethyl ketone, methyl ethyl ketone, methyl isobutyl ketone, toluene, propylene glycol monomethyl ether acetate, n-butyl acetate and the like are particularly preferable.

As oils and fats, vegetable oils and fats or vegetable-derived oils and fats are preferable. As the vegetable oils, drying oils such as linseed oil, sunflower oil, tung oil, and perilla oil; semi-drying oils such as sesame oil, cottonseed oil, rapeseed oil, soybean oil, rice bran oil, and poppy oil; non-drying oils such as olive oil, coconut oil, palm oil, dehydrated castor oil, can be used. As the vegetable oil-derived compound, fatty acid monoesters obtained by direct esterification reaction of fatty acid of vegetable oil and monoalcohol, and ethers are used. Further, commercially available petroleum solvents can also be used as oils and fats, including Isopar E, Exol Hexane, Exol Heptane, Exol E, Exol D30, Exol D40, Exol D60, Exol D80, Exol D95, Exol D110, Exol D130 (all of them are manufactured by Exxon Mobil Corporation), and the like can be mentioned as examples.

Here, the liquid plasticizer includes: for example, a plasticizer which is a compound of monohydric alcohol and organic acid ester, an ester-based plasticizer such as a polyhydric alcohol organic acid ester compound, and a phosphoric acid-based plasticizer such as an organic phosphoric acid-based plasticizer, each of which is preferably in a liquid state at room temperature. Among them, a plasticizer which is an ester compound synthesized from a polyhydric alcohol and a fatty acid is preferable.

The ester compound synthesized from a polyhydric alcohol and a fatty acid is not particularly limited, and specific examples include glycol-based ester compound obtained through a reaction between glycol such as triethylene glycol, tetraethylene glycol, and tripropylene glycol, and monobasic organic acid such as butyric acid, isobutyric acid, caproic acid, 2-ethylbutyric acid, heptylic acid, n-octylic acid, 2-ethylhexylic acid, pelargonic acid (n-nonylic acid), and decylic acid, and also include ester compounds of tetraethylene glycol, tripropylene glycol with the above-described monobasic organic acid.

Among them, fatty acid esters of triethylene glycol such as triethylene glycol dihexanate, triethylene glycol di-2-ethyl butyrate, and triethylene glycol di-octanate, triethylene glycol di-2-ethyl hexanonate, are suitable. Triethylene glycol fatty acid ester is preferable.

Further, a polymer monomer is a monomer that forms a polymer by polymerization or the like, and a preferable polymer monomer used in the present invention includes methyl methacrylate monomer, acrylate monomer, styrene resin monomer, etc.

The liquid solvents described above can be used alone or in combination of two or more. Further, if necessary, pH may be adjusted by adding acid or an alkali to these liquid solvents.

(2) Dispersant to be Used

Further, in order to further improve a dispersion stability of the composite tungsten oxide fine particles in the composite tungsten oxide fine particle dispersion liquid and to avoid coarsening of the dispersed particle size due to re-aggregation, it is also preferable to add various dispersants, surfactants, coupling agents, and the like. The dispersant, coupling agent, and surfactant can be selected according to the intended use, but are preferably those having an amine-containing group, a hydroxyl group, a carboxyl group, or an epoxy group as a functional group. These functional groups have an effect of adsorbing onto the surfaces of the composite tungsten oxide fine particles to prevent aggregation and of uniformly dispersing the composite tungsten oxide fine particles according to the present invention even in the infrared absorbing layer. A polymer dispersant having any of these functional groups in the molecule is more preferable.

Examples of such a dispersant include:

SOLSPERSE (registered trademark) (the description is omitted hereafter in this section) 3000, 5000, 9000, 11200, 12000, 13000, 13240, 13650, 13940, 16000, 17000, 18000, 20000, 21000, 24000SC, 24000GR, 26000, 27000, 28000, 31845, 32000, 32500, 32550, 32600, 33000, 33500, 34750, 35100, 35200, 36600, 37500, 38500, 39000, 41000, 41090, 53095, 55000, 56000, 71000, 76500, J180, J200, M387, and the like, manufactured by Japan Lubrizol Co., Ltd.;

SOLPLUS (registered trademark) (the description is omitted hereafter in this section) D510, D520, D530, D540, DP310, K500, L300, L400, R700, and the like, manufactured by Japan Lubrizol Co., Ltd.;

Disperbyk (registered trademark) (the description is omitted hereafter in this section)—101, 102, 103, 106, 107, 108, 109, 110, 111, 112, 116, 130, 140, 142, 145, 154, 161, 162, 163, 164, 165, 166, 167, 168, 170, 171, 174, 180, 181, 182, 183, 184, 185, 190, 191, 192, 2000, 2001, 2009, 2020, 2025, 2050, 2070, 2095, 2096, 2150, 2151, 2152, 2155, 2163, 2164, manufactured by BYK Japan KK;

Anti-Terra (registered trademark) (the description is omitted hereafter in this section)-U, 203, 204, and the like manufactured by BYK Japan KK;

BYK (registered trademark) (the description is omitted hereafter in this section)-P104, P104S, P105, P9050, P9051, P9060, P9065, P9080, 051, 052, 053, 054, 055, 057, 063, 065, 066N, 067A, 077, 088, 141, 220S, 300, 302, 306, 307, 310, 315, 320, 322, 323, 325, 330, 331, 333, 337, 340, 345, 346, 347, 348, 350, 354, 355, 358N, 361N, 370, 375, 377, 378, 380N, 381, 392, 410, 425, 430, 1752, 4510, 6919, 9076, 9077, W909, W935, W940, W961, W966, W969, W972, W980, W985, W995, W996, W9010, Dynwet800, Siclean3700, UV3500, UV3510, UV3570, and the like, manufactured by BYK Japan KK;

EFKA (registered trademark) (the description is omitted hereafter in this section) 2020, 2025, 3030, 3031, 3236, 4008, 4009, 4010, 4015, 4046, 4047, 4060, 4080, 7462, 4020, 4050, 4055, 4300, 4310, 4320, 4400, 4401, 4402, 4403, 4300, 4320, 4330, 4340, 5066, 5220, 6220, 6225, 6230, 6700, 6780, 6782, 8503, manufactured by EFKA Additives B. V.;

JONCRYL (registered trademark) (the description is omitted hereafter in this section) 67, 678, 586, 611, 680, 682, 690, 819, -JDX5050, and the like, manufactured by BASF Japan Ltd.;

TERPLUS (registered trademark) (the description is omitted hereafter in this section) MD1000, D1180, D1130, and the like, manufactured by Otsuka Chemical Co., Ltd.;

Ajisper (registered trademark) (the description is omitted hereafter in this section) PB-711, PB-821, PB-822, and the like, manufactured by Ajinomoto Fine Techno Co., Ltd.;

DISPARLON (registered trademark) (the description is omitted hereafter in this section) 1751N, 1831, 1850, 1860, 1934, DA-400N, DA-703-50, DA-325, DA-375, DA-550, DA-705, DA-725, DA-1401, DA-7301, DN-900, NS-5210, NVI-8514L, and the like, manufactured by Kusumoto Kasei Ltd.;

ARUFON (registered trademark) (the description is omitted hereafter in this section) UC-3000, UF-5022, UG-4010, UG-4035, UG-4070, and the like, manufactured by Toagosei Co., Ltd.

(3) Pulverization and Dispersion Method

The method for dispersing the composite tungsten oxide fine particles in the dispersion liquid is not particularly limited as long as the fine particles can be uniformly dispersed in the dispersion liquid without aggregation. Examples of the pulverization and dispersion method include a pulverization and dispersion treatment method using a device such as a bead mill, a ball mill, a sand mill, a paint shaker, an ultrasonic homogenizer, or the like. Among them, pulverization and dispersion with a medium stirring mill such as a bead mill, a ball mill, a sand mill, a paint shaker or the like using media such as beads, balls, Ottawa sand, or the like is preferable because the time required for obtaining a desired dispersed particle size is short.

Through the pulverization and dispersion treatment using a medium stirring mill, formation of the fine particles due to the mutual collision of the composite tungsten oxide fine particles and due to the collision of the media against the fine particles also proceeds simultaneously with the dispersion of composite tungsten oxide fine particles the dispersion liquid, and the composite tungsten oxide fine particles can be more finely pulverized and dispersed (namely, they are subjected to pulverization and dispersion treatment).

In this case, from a viewpoint of developing excellent infrared absorption properties in the pulverized and dispersed composite tungsten oxide fine particles, the pulverization and dispersion conditions are adjusted so that the crystallite size is preferably 10 nm or more and 100 nm or less, more preferably 10 nm or more and 80 nm or less, and still more preferably 10 nm or more and 60 nm or less.

When dispersing the composite tungsten oxide fine particles in the plasticizer, it is also a preferable configuration to add an organic solvent having a boiling point of 120° C. or less, if desired.

Specific examples of the organic solvent having the boiling point of 120° C. or less includes toluene, methyl ethyl ketone, methyl isobutyl ketone, butyl acetate, isopropyl alcohol, and ethanol. The organic solvent can be arbitrarily selected, as long as the solvent has a boiling point of 120° C. or less and the fine particles exhibiting an infrared absorption function can be uniformly dispersed. When the organic solvent is added, it is preferable that the drying step is performed after completion of the dispersion so that an amount of the organic solvent remaining in the LTHC layer is 5 mass % or less. This is because when the residual solvent in the LTHC layer is 5 mass % or less, no bubbles are generated, and the appearance and the optical properties are kept good.

(4) Dispersed Particle Size in Composite Tungsten Oxide Fine Particle Dispersion Liquid The dispersed particle size of the composite tungsten oxide fine particles according to the present invention in the composite tungsten oxide fine particle dispersion liquid is preferably 200 nm or less, and more preferably the dispersed particle size is 200 nm or less and 10 nm or more. This is because, with the dispersed particle size of the composite tungsten oxide fine particles being 10 to 200 nm, the haze of the LTHC layer described below can be reduced, which is preferred when the LTHC layer is used for transferring an organic electroluminescence device or the like by irradiation with a laser beam from the viewpoint of improving the accuracy of the processing position and the like and from the viewpoint of increasing the visible light transmittance.

When the dispersed particle size of the fine particles is smaller than 200 nm, transparency can be ensured. However, when importance is placed on the transparency, the dispersed particle size is preferably 150 nm or less, more preferably 100 nm or less. From the viewpoint of avoiding light scattering, the smaller dispersed particle size is more preferable. When the dispersed particle size is 10 nm or more, industrial production is easy.

Here, the dispersed particle size of the composite tungsten oxide fine particles in the composite tungsten oxide fine particle dispersion liquid will be briefly described. The dispersed particle size of the composite tungsten oxide fine particles means a particle size of a single particle of the composite tungsten oxide fine particles dispersed in the solvent, and a particle size of aggregated particles obtained by aggregating the composite tungsten oxide fine particles, and can be measured with various commercially available particle size distribution meters. For example, a sample of the composite tungsten oxide fine particle dispersion liquid is collected, and the sample can be measured using ELS-8000 manufactured by Otsuka Electronics Co., Ltd. based on a dynamic light scattering method.

Further, the composite tungsten oxide fine particle dispersion liquid, in which the content of the composite tungsten oxide fine particles obtained by the above synthesis method is 0.01 mass % or more and 80 mass % or less, has excellent liquid stability. When an appropriate liquid medium, dispersant, coupling agent, and surfactant are selected, no gelation of the dispersion liquid or sedimentation of particles occurs for 6 months or more even when placed in a constant temperature bath at a temperature of 40° C., and the dispersed particle size can be maintained in a range of 1 to 200 nm.

Note that the dispersed particle size in the composite tungsten oxide fine particle dispersion liquid may be different from the dispersed particle size in a LTHC layer described later in some cases. The reason is as follows. The composite tungsten oxide fine particles may be aggregated in the composite tungsten oxide fine particle dispersion liquid in some cases. When producing a LTHC layer using the composite tungsten oxide fine particle dispersion liquid, the aggregation of the composite tungsten oxide fine particles is disintegrated.

(5) Binder and Other Additives

The composite tungsten oxide fine particle dispersion liquid may appropriately contain a binder described below. Further, it is also a preferable configuration to add infrared absorbing particles such as a boride represented by general formula XBm (wherein X is a metal element selected from alkaline earth elements or rare earth elements including yttrium, B is boron, satisfying $4 \leq m \leq 6.3$), ATO and ITO to the dispersion liquid according to the present invention, as needed, in order to improve the infrared absorption properties of the LTHC layer according to the present invention. An addition ratio at this time may be appropriately selected according to the desired infrared absorption properties.

Further, in order to adjust the color tone of the LTHC layer, known inorganic pigments such as carbon black and red iron oxide or known organic pigments can also be added.

A known ultraviolet absorber, a known infrared absorbing material of an organic substance, or a phosphorus-based coloring inhibitor may be added to the composite tungsten oxide fine particle dispersion liquid.

Further, the fine particles having an ability to emit far-infrared radiation may be added. For example, metal oxides such as $ZrO_2$, $SiO_2$, $TiO_2$, $Al_2O_3$, $MnO_2$, MgO, $Fe_2O_3$, and CuO, carbides such as ZrC, SiC, and TiC, and nitrides such as ZrN, $Si_3N_4$, and MN can be mentioned.

[d] Drying Treatment Method of Composite Tungsten Oxide Fine Particle Dispersion Liquid The composite tungsten oxide fine particle dispersion liquid described above can be subjected to drying treatment to remove the solvent, thereby obtaining the composite tungsten oxide fine particles according to the present invention.

As facilities for drying treatment, an air dryer, a universal mixer, a ribbon mixer, a vacuum flow drier, an oscillating fluid drier, a freeze dryer, a ribocone, a rotary kiln, a spray dryer, a pulcon dryer, and the like are preferable, from a viewpoint feasible heating and/or decompression and easy mixing and recovery of the fine particles, but the present invention is not limited thereto.

[2] LTHC Layer

The LTHC layer according to the present invention contains the composite tungsten oxide fine particles which are infrared absorbing particles and a binder component, the composite tungsten oxide fine particles being dispersed in the binder component.

Hereinafter, (1) Binder component, and (2) LTHC layer and its constitution, will be described in this order.

(1) Binder Component

The binder component is not particularly limited, and any binder component can be used. However, in the present invention which aims at providing a LTHC layer having the visible light transmission property, it is preferred to use a binder component excellent in the visible light transmission property when it becomes solid. It is also preferred to use a binder component excellent in the infrared light transmission property, particularly near-infrared light transmission property in order to enable irradiation of the infrared absorbing particles contained in the LTHC layer with a laser beam when the laser beam is irradiated to the LTHC layer.

As the binder component, for example, a UV curable resin (an ultraviolet curable resin), a thermosetting resin, an electron beam curable resin, an ambient temperature curable resin, a thermoplastic resin, or the like can be specifically selected according to the purpose. Examples of the binder component specifically include: polyethylene resin, polyvinyl chloride resin, polyvinylidene chloride resin, polyvinyl alcohol resin, polystyrene resin, polypropylene resin, ethylene vinyl acetate copolymer, polyester resin, polyethylene terephthalate resin, fluororesin, polycarbonate resin, acrylic resin, and polyvinyl butyral resin. These resins may be used alone or in combination.

Further, a metal alkoxide can be used as the binder component. Examples of the metal alkoxide include alkoxides of Si, Ti, Al, Zr, and the like. The binders using such metal alkoxides can form oxide layers by hydrolysis and polycondensation upon heating or the like.

(2) LTHC Layer and its Constitution

As described above, the LTHC layer according to the present invention can generate heat only at a desired location with high positional accuracy. As a result, the present invention is considered to be applicable to a wide variety of fields including electronics, medicine, agriculture, machine, etc.

Hereinafter, the constitution of the LTHC layer according to the present invention will be described in the following order: 1) Ratio of infrared absorbing particles to binder component, 2) Average particle size of infrared absorbing particles in LTHC layer, 3) Solar radiation transmittance of LTHC layer, 4) Thickness of LTHC layer, and 5) Method for producing LTHC layer.

1) Ratio of Infrared Absorbing Particles to Binder Component

The ratio of the infrared absorbing particles to the binder component, included in the LTHC layer, is not particularly limited, and can be arbitrarily selected according to the thickness of the LTHC layer, the laser beam absorption properties required for the LTHC layer, and the like. However, for example, when the LTHC layer is used in various applications, it is preferable to select the ratio of the infrared absorbing particles to the binder component so that the LTHC layer can maintain the form of the layer.

In addition to the infrared absorbing particles and binder component described above, an arbitrary component can be further added to the LTHC layer. Further, as described later, when forming the LTHC layer, for example, a dispersant, a solvent, or the like can be added to an ink which is a raw material of the LTHC layer, and these components may remain and be contained in the LTHC layer.

2) Average Particle Size of Infrared Absorbing Particles in LTHC Layer

The average particle size of the infrared absorbing particles in the LTHC layer is selected according to the degree of transparency required for the LTHC layer, the degree of absorption of the laser beam, or the like. For example, the infrared absorbing particles are preferably fine particles. Specifically, the average particle size of the infrared absorbing particles is preferably 100 nm or less, and more preferably 10 nm or more and 100 nm or less. The reasons are as follows. Since the average particle size of the infrared absorbing particles is 10 nm or more, a laser beam can be sufficiently absorbed when applied to the donor sheet, for example. Further, since the average particle size of the infrared absorbing particles is 100 nm or less, the infrared absorbing particles can be stably dispersed when they are mixed with a dispersant, a solvent, or the like, and therefore they can be coated particularly uniformly on a base material. As a result, the visible light transmission property can be retained and the transparency of the LTHC layer can be enhanced.

Further, when the average particle size of the infrared absorbing particles is 10 nm or more and 100 nm or less and the infrared absorbing particles are not aggregated, light is not scattered by geometric scattering or Mie scattering. Accordingly, haze is reduced. Applying the result to, for example, transfer of an organic electroluminescence device or the like by irradiation with a laser beam, the LTHC layer according to the present invention do not scatter light. Therefore, it is preferable from the viewpoint of improving the accuracy of the processing position and the like and from the viewpoint of increasing visible light transmittance. Further, in the Rayleigh scattering region, the scattered light is decreased in proportion to the sixth power of the particle size. Therefore, with the decrease of the dispersed particle size, the scattering is reduced, and the transparency is improved. Accordingly, when the average particle size is 100 nm or less, the scattered light is greatly decreased, which is preferable.

Since the LTHC layer according to the present invention can generate heat only at a desired location with high positional accuracy, it is considered to be applicable in a wide range of fields including electronics, medicine, agriculture, machine, and the like.

For example, in the field of organic electroluminescence in electronics, it enables curing of a thermosetting resin, thermal transfer, or the like. Specifically, when the LTHC layer of the present invention is applied to the donor sheet used for producing the organic electroluminescence device or the like by irradiation with a laser beam, the donor sheet having the visible light transmission property or the like can be produced which can improve the transfer accuracy owing to low haze.

From the above-described viewpoints, the haze of the LTHC layer is preferably 3% or less.

The average particle size is calculated from a method using an electron microscope described in the items of "[1] Composite tungsten oxide fine particles, [a] Characteristics of composite tungsten oxide fine particles, and (2) Particle size and crystallite size" described above.

3) Solar Radiation Transmittance of LTHC Layer

The LTHC layer according to the present invention preferably has the solar radiation transmittance of 45% or less. Because sufficient heat generation can be obtained in a LTHC layer when the solar radiation transmittance of the LTHC layer is 45% or less.

It is caused, for example, by using a laser beam having a wavelength mainly in the near-infrared region, particularly wavelength around 1000 nm when transferring a transfer layer in a donor sheet, for example. Therefore, the LTHC layer preferably has high absorptance of light in such a region. In other words, it is preferable for the LTHC layer to have low transmittance of light in such a region. When the solar radiation transmittance is 45% or less, the LTHC layer can sufficiently absorb light having wavelength around 1000 nm to generate heat, which is preferable. In order to sufficiently absorb light of the wavelength around 1000 nm, the LTHC layer preferably has transmittance of light of the wavelength 1000 nm being 20% or less, and more preferably 15% or less.

The thickness of the LTHC layer is selected according to the infrared absorption properties of the infrared absorbing particles added to the LTHC layer, the packing density of the infrared absorbing particles in the LTHC layer, the required visible light transmittance, the required degree of the solar radiation transmittance, or the like.

4) Thickness of LTHC Layer

The thickness of the LTHC layer according to the present invention is preferably 5 μm or less, and more preferably 3 μm or less, for example. This is because, when the thickness of the LTHC layer is increased, the heat generated by irradiating the LTHC layer with a laser beam becomes to easily diffuse. For example, when used as the LTHC layer of the donor sheet, in the LTHC layer having the thickness of 5 μm or less, heat does not diffuse in the in-plane direction from the point where the laser beam is irradiated, and the transfer layer is not delaminated nor transferred in the portion not irradiated with the laser beam, which is preferable.

The lower limit of the thickness of the LTHC layer is not particularly limited, and may be arbitrarily selected according to the infrared absorption properties of the infrared absorbing particles, or the like. However, the thickness of the LTHC layer is preferably 500 nm or more, and more preferably 1 μm or more. This is because the LTHC layer having the thickness of 500 nm or more can retain the amount of heat generated when irradiated with the laser beam, so that it is easy to maintain the shape of the LTHC layer without excessively increasing the density of the infrared absorbing particles dispersed in the LTHC layer.

5) Method for Producing LTHC Layer

A configuration example of the method for producing the LTHC layer according to the present invention will be described.

The above-described LTHC layer can be formed, for example, by mixing the above-described composite tungsten oxide fine particle dispersion liquid and a binder component to produce an ink, coating the ink on a base material, drying the coated ink, and then curing the dried ink. In other words, the ink contains infrared absorbing particles, a dispersant, a solvent, and a binder component.

A film base material is an exemplary base material on which the ink containing infrared absorbing particles, a dispersant, a solvent, and a binder component is coated. Although the base material may be constituted by a film base material alone, a base material with an arbitrary layer formed thereon may also be used.

Therefore, coating the ink containing the infrared absorbing particles, the dispersant, the solvent, and the binder component onto the base material is not limited to the case where the ink is directly coated onto the film base material. For example, it also includes a case where an interlayer described later, or the like is formed on the film base material and the ink is coated onto the interlayer formed on the film base material. The LTHC layer can be formed by coating an ink, then drying and curing the ink, also in the case where an arbitrary layer is placed on the film base material as described above.

The method for producing the LTHC layer according to the present invention will be described hereinafter in the following order: (I) Ink production step, (II) Ink coating step, (III) Ink drying step, (IV) Ink curing step, and (V) Produced LTHC layer.

(I) Ink Production Step

The ink for forming the LTHC layer can be produced by mixing the composite tungsten oxide fine particle dispersion liquid and binder component described above. When the ink is produced, it is sufficient to mix the tungsten oxide fine particles and the binder component to the extent that they are well blended.

The method for mixing the dispersion liquid and the binder component is not particularly limited, and, for example, the dispersion liquid can also be mixed with the binder component using the same pulverization and dispersion measure as those used for preparing the dispersion liquid. When the ink is produced as described above, it is sufficient to mix the dispersion and the binder component to the extent that they are well blended. Therefore, the mixing time can be shortened compared to that in preparing the dispersion liquid.

At the time of completion of the mixing, it is sufficient that the lattice constant of the composite tungsten oxide fine particles is such that the a-axis is 7.3850 Å or more and 7.4186 Å or less, and the c-axis is 7.5600 Å or more and 7.6240 Å or less.

(II) Ink Coating Step

The method for coating the ink on the base material is not particularly limited, and the ink can be coated, for example, by a bar coating method, a gravure coating method, a spray coating method, a dip coating method, or the like.

The film base material is not particularly limited, and arbitrary film base material can be used depending on the intended use. For example, a film base material similar to that for the donor sheet described later can be used.

(III) Ink Drying Step

In the ink drying step, the method for drying the ink is not particularly limited. For example, drying can be performed selecting the heating temperature according to the boiling point of the solvent used.

(IV) Ink Curing Step

In the ink curing step, the method for curing the ink dried in the drying step is not particularly limited. The ink can be cured by a method according to the resin and the like of the binder component or the like. For example, in the case where the binder component is a UV curable resin, the ink can be cured by irradiation with the ultraviolet radiation. Further, in the case where the binder component is a thermosetting resin, the ink can be cured by increasing the temperature up to the curing temperature.

(V) Produced LTHC Layer

According to the above-described steps, the LTHC layer according to the present invention can be obtained. The LTHC layer according to the present invention can be used for various applications requiring a LTHC layer that absorbs a laser beam to generate heat. Although the intended use is not particularly limited, for example, it can be suitably used as a LTHC layer of a donor sheet, a thermo-sensitive paper for a thermal printer, or an ink ribbon for a thermal transfer printer.

[3] Film Base Material

The film base material according to the present invention will be described with reference to FIG. 3, which is an explanatory diagram of a cross-sectional constitution example of the donor sheet according to the present invention.

In the donor sheet 20 according to the present invention, the film base material 21 is a layer that supports the LTHC layer 22 and the transfer layer 23. When the donor sheet 20 is irradiated with a laser beam, for example, it is irradiated with a laser beam having a wavelength around 1000 nm from the other surface 21B side of the film base material 21. Accordingly, the film base material 21 is preferably excellent in the light transmission property, particularly in the near-infrared region so that the laser beam can be transmitted to the LTHC layer 22. Further, it is preferable that the film base material 21 is preferably excellent in the visible light transmission property as well so that a defect such as a foreign matter or uneven coating in the donor sheet 20 can be detected by visual observation or by using a visible light sensor or the like.

Therefore, a material excellent in the visible light transmission property and the near-infrared light transmission property can be preferably used as the film base material 21. Specifically, for example, one or more kinds of materials selected from glass, polyethylene terephthalate (PET), acryl, urethane, polycarbonate, polyethylene, ethylene vinyl acetate copolymer, vinyl chloride, fluororesin, and the like can be used as the film base material 21.

The thickness of the film base material 21 is not particularly limited, and can be arbitrarily selected depending on the type of material used for the film base material 21, the visible light transmission property and near-infrared radiation transmission property required for the donor sheet, and the like.

The thickness of the film base material 21 is preferably, for example, 1 μm or more and 200 μm or less, and more preferably 2 μm or more and 50 μm or less. The reason is as follows. The visible light transmission property and near-infrared radiation transmission property can be increased by setting the thickness of the film base material 21 to 200 μm or less, which is preferable. In addition, the LTHC layer 22 formed on the film base material 21 and the like can be supported by setting the thickness of the film base material 21 to 1 μm or more, thereby the donor sheet 20 can be prevented from being broken, in particular.

[4] Transfer Layer

The transfer layer according to the present invention will be described with reference to FIG. 3, which is an explanatory diagram of a cross-sectional constitution example of the donor sheet according to the present invention.

In the donor sheet 20 according to the present invention, the transfer layer 23 is a layer that is peeled off and transferred from the donor sheet 20 by irradiating the donor sheet 20 with a laser beam, and it may be an arbitrary layer with its constitution not particularly limited. Further, FIG. 3 illustrates an example in which the transfer layer 23 is constituted by a single layer, but the present invention is not limited thereto. For example, the transfer layer 23 may be constituted by two or more layers.

As described above, the donor sheet 20 can be used, for example, for forming the organic electroluminescence device. Therefore, the transfer layer 23 can be constituted to include, for example, one or more layers selected from a hole injection layer, a hole transport layer, an organic light emitting layer, an electron transport layer, a blocking layer, and the like that constitute the organic electroluminescence device.

The method for forming the transfer layer 23 is not particularly limited, and the transfer layer 23 can be formed by an arbitrary method depending on the type of the material constituting the layer.

In addition, the donor sheet 20 can be used not only for forming the organic electroluminescence device but also for forming various electronic devices such as electronic circuits, resistors, capacitors, diodes, rectifiers, memory elements, transistors, and various optical devices such as optical waveguides. Therefore, the transfer layer 23 can be of an arbitrary constitution depending on the intended use.

An exemplary constitution of the donor sheet has been described so far, but the constitution of the donor sheet is not limited thereto, and an arbitrary layer can be added. For example, an interlayer can be provided between the LTHC layer 22 and the transfer layer 23 to suppress damage and contamination of a portion to be transferred of the transfer layer 23.

The constitution of the interlayer is not particularly limited, and can be constituted, for example, by a polymer film, a metal layer, an inorganic layer (for example, a layer of inorganic oxide such as silica or titania), or an organic/inorganic composite layer.

An order of stacking each layer of the donor sheet is not limited to the form illustrated in FIG. 3. For example, the transfer layer 23 can be placed on one surface 21A of the film base material 21 while the LTHC layer 22 can be placed on the other surface 21B.

[5] Donor Sheet

An exemplary constitution of the LTHC layer according to the present invention has been described. The donor sheet according to the present invention has the above-described LTHC layer according to the present invention. Since the LTHC layer according to the present invention has a high visible light transmittance, a defect in the donor sheet can be detected by visual observation or by using a visible light sensor or the like even through the LTHC layer, and the defective donor sheet can be removed by inspection. Therefore, it is possible to obtain high yield when an electronic device such as an organic electroluminescence device or an optical device is produced using the donor sheet according to the present invention. Furthermore, since the LTHC layer according to the present invention has low haze, the LTHC layer according to the present invention serves as a donor sheet capable of improving the positional accuracy when the organic electroluminescence device or the like is transferred by irradiation with a laser beam.

EXAMPLES

The present invention will be hereinafter described with reference to specific examples, but the present invention is not limited to these examples. In the following Examples 1 to 18 and Comparative Examples 1 to 4, the LTHC layers and donor sheets were produced and evaluated.

In the measurement of the crystal structure, the lattice constant, and the crystallite size of the composite tungsten oxide fine particles according to the present invention, the composite tungsten oxide fine particles obtained after removal of a solvent from the composite tungsten oxide fine particle dispersion liquid were used. Then, an X-ray diffraction pattern of the composite tungsten oxide fine particles was measured by a powder X-ray diffraction method (0-20 method) using a powder X-ray diffraction apparatus (X'Pert-PRO/MPD made by Spectris Corporation, PANalytical). From thus obtained X-ray diffraction pattern, the crystal structure contained in the fine particle was identified, and the lattice constant and the crystallite size were calculated using the Rietveld method.

Example 1

(Production of LTHC Layer)

A LTHC layer was produced according to the following procedure.

In 6.70 kg of water, 7.43 kg of cesium carbonate ($Cs_2CO_3$) was dissolved to obtain a solution. The solution was added to 34.57 kg of tungstic acid ($H_2WO_4$) and sufficiently stirred and mixed, and thereafter dried while stirring (the molar ratio between W and Cs is equivalent to 1:0.33). The dried product was heated while supplying 5 vol % of $H_2$ gas using $N_2$ gas as a carrier, and fired at a temperature of 800° C. for 5.5 hours, and thereafter, the supply gas was switched to $N_2$ gas only, and the temperature was lowered to room temperature to obtain the composite tungsten oxide particles.

Ten mass % of the composite tungsten oxide particles, 10 mass % of an acrylic polymer dispersant having an amine-containing group as a functional group (an acrylic dispersant having an amine value of 48 mg KOH/g and a decomposition temperature of 250° C.) (referred to as "dispersant a" hereafter), and 80 mass % of toluene were weighed and charged in a paint shaker (manufactured by Asada Iron Works Co., Ltd.) containing 0.3 mmφ $ZrO_2$ beads, then subjected to pulverization and dispersion treatment for 10 hours to prepare a composite tungsten oxide fine particle dispersion liquid according to Example 1. At this time, 100 parts by mass of the mixture was subjected to pulverization and dispersion treatment using 300 parts by mass of 0.3 mmφ $ZrO_2$ beads.

Regarding the dispersed particle size of the composite tungsten oxide fine particles in the composite tungsten oxide fine particle dispersion liquid, fluctuations in the scattered laser beam was observed using ELS-8000 manufactured by Otsuka Electronics Co., Ltd., the autocorrelation function was determined by the dynamic light scattering method (photon correlation method), and the average particle size (hydrodynamic diameter) was calculated to be 70 nm by the cumulant method.

As a setting of the particle size measurement, the particle refractive index was 1.81 and the particle shape was considered as non-spherical. In addition, the background was measured using toluene, and the solvent refractive index was 1.50.

When the lattice constant of the composite tungsten oxide fine particles obtained after removing the solvent from the composite tungsten oxide fine particle dispersion liquid was measured, the a-axis was 7.4071 Å and the c-axis was 7.6188 Å. The crystallite size was 24 nm. The hexagonal crystal structure was confirmed. Table 1 illustrates the above-described synthesis conditions and measurement results. Table 1 also illustrates the synthesis conditions and measurement results according to Example 2 to 17 described later.

Further, the visible light transmittance and the solar radiation transmittance as optical properties of the composite tungsten oxide fine particle dispersion liquid were measured based on JIS R 3106 (1998) using a spectrophotometer U-4100 manufactured by Hitachi, Ltd. The measurement was performed with a glass cell for measurement of a spectrophotometer filled with a liquid obtained by diluting the composite tungsten oxide fine particle dispersion liquid with toluene. The dilution with toluene was performed so that the visible light transmittance of the composite tungsten oxide fine particle dispersion liquid after dilution was approximately 70%.

In the measurement, the light incident direction of the spectrophotometer was a direction perpendicular to the glass cell for measurement.

Further, the light transmittance was also measured in a blank liquid, only toluene as a dilution solvent placed in the glass cell for measurement, and the measurement result was considered as a baseline of the light transmittance.

As a result of measuring the optical properties of the composite tungsten oxide fine particle dispersion liquid, the visible light transmittance was 70.2% and the solar radiation transmittance was 34.9%.

Next, the obtained composite tungsten oxide fine particle dispersion liquid was mixed with an UV curable resin and methyl isobutyl ketone to produce an ink according to Example 1, which was coated on a 50 μm-thick PET film using a bar coater (IMC-700, manufactured by IMOTO MACHINERY CO., LTD.) to form a coated layer. The coated layer was cured at 80° C. for 60 seconds to evaporate the solvent. Then, the coated layer was cured by irradiation with the ultraviolet radiation, thereby producing the LTHC layer containing the composite tungsten oxide fine particles on the film base material.

The average particle size of the composite tungsten oxide fine particles dispersed in the LTHC layer was 25 nm as calculated by an image processor using a transmission electron microscope image. The layer thickness of the LTHC layer was 2.5 μm from the TEM image.

The optical properties of the sheet including the LTHC layer were measured at intervals of 5 nm in a wavelength range of 200 nm to 2600 nm using a spectrophotometer (U-4100, manufactured by Hitachi, Ltd.). The optical properties of the used film base material itself was used were measured in the same manner, and subtracted from the above-described measurement values to calculate the optical properties of the LTHC layer. As a result, the visible light transmittance was 69.8%, the solar radiation transmittance was 35.9%, and the transmittance at the wavelength of 1000 nm was 5%.

The haze of the sheet including the LTHC layer was evaluated using a haze meter (HM-150, manufactured by MURAKAMI COLOR RESEARCH LABORATORY) based on JIS K 7105, and found to be 0.9%. The haze of the used film base material itself was measured in the same manner and found to be 0.8%. In view of the foregoing, it was found that there was almost no haze derived from the LTHC layer, and that the composite tungsten oxide fine particles in the LTHC layer were not aggregated.

Table 2 illustrates the evaluation results.

(Production of Donor Sheet)

A transfer layer was further formed on the produced LTHC layer to form a donor sheet. The donor sheet was formed to have the structure explained in FIG. 3.

Specifically, a transfer layer 23 was formed on the top surface of the LTHC layer 22. As the transfer layer 23, an electron transport layer, an organic light emitting layer, a hole transport layer, and a hole injection layer were sequentially stacked from the LTHC layer 22 side.

Each layer included in the transfer layer 23 was formed as follows.

The electron transport layer was formed from Alq3 [tris (8-quinolinolato) aluminum (III)] by a vapor deposition method to have a layer thickness of 20 nm.

In addition, the organic light-emitting layer was formed by a vapor deposition method from a material obtained by mixing ADN (anthracene dinaphthyl) as an electron transporting host material with 2.5% by weight of 4,4'-bis [2-{4-(N, N-diphenylamino)phenyl}vinyl]biphenyl (DPAVBi) as a blue light emitting guest material, to have a layer thickness of about 25 nm.

The hole transport layer was formed by a vapor deposition method from α-NPD [4,4-bis (N-1-naphthyl-N-phenylamino) biphenyl] to have a layer thickness of 30 nm.

The hole injection layer was formed by a vapor deposition method from m-MTDATA [4,4,4-tris (3-methylphenylphenylamino) triphenylamine] to have a layer thickness of 10 nm.

The condition of the obtained donor sheet was verified by visually observing the transfer layer 23 from the film base material side.

Examples 2 to 11

The same operations as in Example 1 were repeated except that predetermined amounts of tungstic acid and cesium carbonate or ammonium metatungstate aqueous solution (equivalent to 50 mass % in $WO_3$) and cesium carbonate were weighed such that the molar ratio of W and Cs was 1:0.21 to 0.37. Then, the composite tungsten oxide particles and the composite tungsten oxide fine particle dispersion liquids according to Examples 2 to 11 were obtained. Further, using the composite tungsten oxide fine particle dispersion liquid, the LTHC layer and the donor sheet were obtained, and their properties were measured. At this time, the mixing ratio of the composite tungsten oxide fine particle dispersion liquid according to Examples 2 to 11 and the UV curable resin used in Example 1 and methyl isobutyl ketone was adjusted to form the LTHC layer having the layer thickness of 2.5 μm and the light transmittance at a wavelength 1000 nm of 5%, which were the same as those in Example 1. The hexagonal crystal structure was confirmed in any of the composite tungsten oxide fine particle samples. Tables 1 and 2 illustrate the synthesis conditions, production conditions, and measurement results according to Examples 2 to 11.

Example 12

In the synthesis of the composite tungsten oxide particles described in Example 1, the same operations as in Example 1 were repeated except that firing was performed at a temperature of 550° C. for 9.0 hours while supplying 5% $H_2$ gas using $N_2$ gas as a carrier. Then, the composite tungsten oxide particles and the composite tungsten oxide fine particle dispersion liquid according to Example 12 were obtained. Further, using the composite tungsten oxide fine particle dispersion liquid, the LTHC layer and the donor sheet were obtained, and their properties were measured. At this time, the mixing ratio of the composite tungsten oxide fine particle dispersion liquid according to Example 12 and the UV curable resin used in Example 1 and methyl isobutyl ketone was adjusted to form the LTHC layer having the layer thickness of 2.5 μm and the light transmittance at a wavelength 1000 nm of 5%, which were the same as those in Example 1. The hexagonal crystal structure was confirmed in any of the composite tungsten oxide fine particle samples. Tables 1 and 2 illustrate the synthesis conditions, production conditions, and measurement results according to Example 12.

Examples 13 to 17

In 6.70 kg of water, 5.56 kg of rubidium carbonate ($Rb_2CO_3$) was dissolved to obtain a solution. The solution was added to 36.44 kg of tungstic acid ($H_2WO_4$), sufficiently stirred and mixed, and then dried while stirring to obtain a dried product according to Example 13 (the molar ratio of W and Rb was 1:0.33).

In 6.70 kg of water, 0.709 kg of cesium carbonate ($Cs_2CO_3$) and 5.03 kg of rubidium carbonate ($Rb_2CO_3$) were dissolved to obtain a solution. The solution was added to 36.26 kg of tungstic acid ($H_2WO_4$), sufficiently stirred and mixed, and then dried with stirring to obtain a dried product according to Example 14 (the molar ratio of W to Cs is equivalent to 1:0.03 and the molar ratio of W and Rb is equivalent to 1:0.30).

In 6.70 kg of water, 4.60 kg of cesium carbonate ($Cs_2CO_3$) and 2.12 kg of rubidium carbonate ($Rb_2CO_3$) were dissolved to obtain a solution. The solution was added to 35.28 kg of tungstic acid ($H_2WO_4$), sufficiently stirred and mixed, and then dried with stirring to obtain a dried product according to Example 15 (the molar ratio of W to Cs is equivalent to 1:0.20 and the molar ratio of W and Rb is equivalent to 1:0.13).

In 6.70 kg of water, 5.71 kg of cesium carbonate ($Cs_2CO_3$) and 1.29 kg of rubidium carbonate ($Rb_2CO_3$) were dissolved to obtain a solution. The solution was added to 35.00 kg of tungstic acid ($H_2WO_4$), sufficiently stirred and mixed, and then dried with stirring to obtain a dried product according to Example 16 (the molar ratio of W to Cs is equivalent to 1:0.25 and the molar ratio of W and Rb is equivalent to 1:0.08).

In 6.70 kg of water, 6.79 kg of cesium carbonate ($Cs_2CO_3$) and 0.481 kg of rubidium carbonate ($Rb_2CO_3$) were dissolved to obtain a solution. The solution was added to 34.73 kg of tungstic acid ($H_2WO_4$), sufficiently stirred and mixed, and then dried with stirring to obtain a dried product according to Example 17 (the molar ratio of W to Cs is equivalent to 1:0.30 and the molar ratio of W and Rb is equivalent to 1:0.03).

The dried products according to Examples 13 to 17 were heated while supplying 5% $H_2$ gas using $N_2$ gas as a carrier, and after firing at a temperature of 800° C. for 5.5 hours, the supply gas was switched to $N_2$ gas only. Then, the temperature was lowered to room temperature to obtain the composite tungsten oxide particles according to Examples 13 to 17.

The same operations as in Example 1 were repeated except that the composite tungsten oxide particles according to Examples 13 to 17 were used in place of the composite tungsten oxide particles according to Example 1, and the composite tungsten oxide fine particle dispersion liquids according to Examples 13 to 17 were obtained. Further, using the composite tungsten oxide fine particle dispersion liquid, the LTHC layer and the donor sheet were obtained, and their properties were measured. At this time, the mixing ratio of the composite tungsten oxide fine particle dispersion liquid according to Examples 13 to 17 and the UV curable resin used in Example 1 and methyl isobutyl ketone was adjusted to form the LTHC layer having the layer thickness of 2.5 μm and the light transmittance at a wavelength 1000 nm of 5%, which were the same as those in Example 1. The hexagonal crystal structure was confirmed in any of the composite tungsten oxide fine particle samples. Tables 1 and 2 illustrate the synthesis conditions, production conditions, and measurement results according to Examples 13 to 17.

Example 18

The same operations as in Example 1 were repeated except that the layer thickness of the LTHC layer was 3.0 μm in the method for producing the LTHC layer explained in Example 1, and the LTHC layer and the donor sheet according to Example 18 were obtained. Tables 1 and 2 illustrate the synthesis conditions, production conditions, and measurement results according to Example 18.

Comparative Examples 1 to 3

The same operations as in Example 1 were repeated except that predetermined amounts of tungstic acid and cesium carbonate were weighed such that the molar ratio of W and Cs was 1:0.11 (Comparative Example 1), 1:0.15 (Comparative Example 2), and 1:0.39 (Comparative Example 3), respectively. Then, the composite tungsten oxide fine particle dispersion liquids according to Comparative examples 1 to 3 were obtained. Further, using the composite tungsten oxide fine particle dispersion liquid, the LTHC layer and the donor sheet were obtained, and their properties were measured. The hexagonal crystal structure was confirmed in any of the composite tungsten oxide fine particle samples. Tables 3 and 4 illustrate the synthesis conditions, production conditions, and measurement results according to Comparative Examples 1 to 3.

At this time, the mixing ratio of the composite tungsten oxide fine particle dispersion liquid according to Comparative examples 1 to 3 and the UV curable resin used in Example 1 and methyl isobutyl ketone was adjusted to form the LTHC layer having the layer thickness of 2.5 μm and the light transmittance at a wavelength 1000 nm of 5%, which were the same as those in Example 1.

The optical properties were measured in the same manner as in Example 1 for the LTHC layers according to Comparative Examples 1 to 3 in which the light transmittance at the wavelength 1000 nm was 5% and the layer thickness was 2.5 μm. As a result, in the case of Comparative Example 1, the visible light transmittance was 26.3%, the solar radiation transmittance was 13.1%, and the haze was 5.4%; in the case of Comparative Example 2, the visible light transmittance was 27.7%, the solar radiation transmittance was 13.2%, and the haze was 5.2%; and in the case of Comparative Example 3, the visible light transmittance was 28.8%, the solar radiation transmittance was 12.9%, and the haze was 4.8%. Further, according to visual observation, they were found to be not completely transparent.

Comparative Examples 4 and 5

The same operations as in Example 1 were repeated, except that the predetermined amounts of tungstic acid and cesium carbonate were weighed such that the molar ratio of W and Cs was 1:0.21 (Comparative Example 4) and 1:0.23 (Comparative Example 5) and fired at the temperature of 400° C. for 5.5 hours. Then, the composite tungsten oxide particles and the composite tungsten oxide fine particle dispersion liquids according to Comparative Examples 4 and 5 were obtained. Further, using the composite tungsten oxide fine particle dispersion liquid, the LTHC layer and the donor sheet were obtained, and their properties were measured. At this time, the mixing ratio of the composite tungsten oxide fine particle dispersion liquid according to Comparative Examples 4 and 5 and the UV curable resin used in Example 1 and methyl isobutyl ketone was adjusted to form the LTHC layer having the layer thickness of 2.5 μm and the light transmittance at a wavelength 1000 nm of 5%, which were the same as those in Example 1. The hexagonal crystal structure was confirmed in any of the composite tungsten oxide fine particle samples. Tables 3 and 4 illustrate the synthesis conditions, production conditions, and measurement results according to Comparative Examples 4 and 5.

Comparative Example 6

The same operations as in Example 1 were repeated, except that the rotation speed of the paint shaker was 0.8 times that of Example 1 and that pulverization and dispersion treatment was performed for 100 hours in the production of the composite tungsten oxide particle dispersion liquid according to Example 1. Then, the composite tungsten oxide fine particle dispersion liquid according to Comparative Example 6 was obtained. Further, the same operations as in Example 1 were repeated to obtain the LTHC layer and the donor sheet, and their properties were measured. At this time, the mixing ratio of the composite tungsten oxide fine particle dispersion liquid according to Comparative Example 6 and the UV curable resin used in Example 1 and methyl isobutyl ketone was adjusted to form the LTHC layer having the layer thickness of 2.5 μm and the transmittance at a wavelength 1000 nm of 5%, which were the same as those in Example 1. The hexagonal crystal structure was confirmed in any of the composite tungsten oxide fine particle samples. Tables 3 and 4 illustrate the synthesis conditions, production conditions, and measurement results according to Comparative Example 6.

Comparative Example 7

The same operations as in Example 1 were repeated except that firing was performed at a temperature of 440° C. for 5.5 hours while supplying 3 vol % $H_2$ gas using $N_2$ gas as a carrier in the production of the composite tungsten oxide particles according to Example 1. Then, the composite tungsten oxide particles and the composite tungsten oxide fine particle dispersion liquid according to Comparative Example 7 were obtained. Further, the same operations as in Example 1 were repeated to obtain the LTHC layer and the donor sheet, and their properties were measured. At this time, the mixing ratio of the composite tungsten oxide fine particle dispersion liquid according to Comparative Example 7 and the UV curable resin used in Example 1 and methyl isobutyl ketone was adjusted to form the LTHC layer having the layer thickness of 2.5 μm and the transmittance at a wavelength 1000 nm of 5%, which were the same as those in Example 1. The hexagonal crystal structure was confirmed in any of the composite tungsten oxide fine particle samples. Tables 3 and 4 illustrate the synthesis conditions, production conditions, and measurement results according to Comparative Example 7.

Comparative Example 8

The composite tungsten oxide fine particle dispersion liquid according to Comparative Example 8 was obtained in the same manner as in Example 1 except that 10 mass % of the composite tungsten oxide particles, 10 mass % of the dispersant a, and 80 mass % of toluene were weighed and mixed by ultrasonic vibration for 10 minutes in the production of the composite tungsten oxide fine particle dispersion liquid according to Example 1. That is, the composite tungsten oxide fine particles contained in the composite tungsten oxide fine particle dispersion liquid according to Comparative Example 8 were not pulverized. Further, the same operations as in Example 1 were repeated to obtain the LTHC layer and the donor sheet, and their properties were measured. At this time, the mixing ratio of the composite tungsten oxide fine particle dispersion liquid according to Comparative Example 8 and the UV curable resin used in Example 1 and methyl isobutyl ketone was adjusted to form the LTHC layer having the layer thickness of 2.5 μm and the transmittance at a wavelength 1000 nm of 5%, which were the same as those in Example 1. The hexagonal crystal structure was confirmed in any of the composite tungsten oxide fine particle samples. Tables 3 and 4 illustrate the synthesis conditions, production conditions, and measurement results according to Comparative Example 8.

Comparative Example 9

The same operations as in Example 1 were repeated, except that the rotation speed of the paint shaker was 1.15 times that of Example 1 and that pulverization and dispersion treatment was performed for 25 hours in the pulverization and dispersion treatment of the composite tungsten oxide particle dispersion liquid according to Example 1. Then, the composite tungsten oxide fine particle dispersion liquid according to Comparative Example 9 was obtained. Further, the same operations as in Example 1 were repeated to obtain the LTHC layer and the donor sheet, and their properties were measured. At this time, the mixing ratio of the composite tungsten oxide fine particle dispersion liquid according to Comparative Example 9 and the UV curable resin used in Example 1 and methyl isobutyl ketone was adjusted to form the LTHC layer having the layer thickness of 2.5 μm and the transmittance at a wavelength 1000 nm of 5%, which were the same as those in Example 1. The hexagonal crystal structure was confirmed in any of the composite tungsten oxide fine particle samples. Tables 3 and 4 illustrate the synthesis conditions, production conditions, and measurement results according to Comparative Example 9.

Comparative Example 10

The LTHC layer and the donor sheet were produced by changing the infrared absorbing particles from composite tungsten oxide fine particles to carbon black.

The dispersion liquid was prepared by pulverizing and dispersing carbon black (BET specific surface area, 300 $m^2/g$), a dispersant, and a solvent. The dispersion liquid contains 10 mass % of carbon black.

As the dispersant, the same dispersant a as in Example 1 was used and weighed so that the percentage in the dispersion liquid was 5% by weight.

As the solvent, methyl isobutyl ketone was used and weighed so that the percentage in the dispersion liquid was 85% by weight.

The infrared absorbing particles, the dispersant, and the solvent were loaded into a paint shaker (manufactured by Asada Iron Works Co., Ltd.) containing 0.3 mmφ $ZrO_2$ beads, subjected to pulverization and dispersion treatment for 4 hours to obtain a carbon black particle dispersion liquid (hereinafter abbreviated as dispersion liquid B). At this time, 100 parts by mass of the mixture was subjected to pulverization and dispersion treatment using 300 parts by mass of 0.3 mmφ $ZrO_2$ beads.

The dispersed particle size of the carbon black particles in the dispersion liquid according to Comparative Example 10 was measured in the same manner as in Example 1, and it was confirmed to be 17 nm.

Next, an ink was prepared by mixing the obtained dispersion liquid according to Comparative Example 10 and a binder component. In this comparative example, the same UV-3701 as in Example 1 was used as the binder component.

The ink according to Comparative Example 10 containing carbon black particles was obtained by mixing 100 parts by mass of the dispersion liquid according to Comparative Example 5 with 100 parts by mass of UV-3701.

The average particle size of the carbon black particles was measured in the same manner as in Example 1 and confirmed to be 17 nm even after production of the ink.

Next, the obtained ink (coating solution) was coated onto a 50 μm-thick PET film using a bar coater to form a coated layer. Then, the LTHC layer was obtained after drying and curing by UV irradiation in the same manner as in Example 1.

TEM observation was performed on the cross section of the film base material in the same manner as in Example 1, and it was confirmed that the thickness of the LTHC layer was about 2.5 μm.

The visible light transmittance of the LTHC layer and the light transmittance at a wavelength 1000 nm were calculated in the same manner as in Example 1, and it was confirmed that the visible light transmittance was 2.0%. In addition, it was confirmed that the light transmittance at a wavelength 1000 nm was 13%. Tables 3 and 4 illustrate the measurement results according to Comparative Example 10.

In addition, a transfer layer was further formed on the produced LTHC layer in the same manner as in Example 1 to form a donor sheet.

TABLE 1

| | Raw Material | Molar ratio | | Firing condition | | | Composite tungsten oxide fine particles | | | |
|---|---|---|---|---|---|---|---|---|---|---|
| | | | | Atmosphere $H_2$ concentration | Temperature | Time | Dispersed particle size | Lattice constant | | Crystallite size |
| | Compound | Cs/W | Rb/W | [%] | [°C.] | [h] | [nm] | a-axis [Å] | c-axis [Å] | [nm] |
| Example 1 | $Cs_2CO_3$ and | 0.33 | — | 5 | 800 | 5.5 | 70 | 7.4071 | 7.6188 | 24 |
| Example 2 | $H_2WO_4$ | 0.31 | — | 5 | 800 | 5.5 | 70 | 7.4100 | 7.6138 | 24 |
| Example 3 | | 0.35 | — | 5 | 800 | 5.5 | 70 | 7.4065 | 7.6203 | 24 |
| Example 4 | | 0.37 | — | 5 | 800 | 5.5 | 70 | 7.4066 | 7.6204 | 24 |
| Example 5 | $Cs_2CO_3$ and ammonium metatungstate aqueous solution | 0.33 | — | 5 | 800 | 5.5 | 70 | 7.4065 | 7.6193 | 24 |
| Example 6 | $Cs_2CO_3$ and | 0.21 | — | 5 | 800 | 5.5 | 70 | 7.4186 | 7.5825 | 24 |
| Example 7 | $H_2WO_4$ | 0.23 | — | 5 | 800 | 5.5 | 70 | 7.4184 | 7.5823 | 24 |
| Example 8 | | 0.25 | — | 5 | 800 | 5.5 | 70 | 7.4165 | 7.5897 | 24 |
| Example 9 | | 0.27 | — | 5 | 800 | 5.5 | 70 | 7.4159 | 7.5919 | 24 |
| Example 10 | | 0.29 | — | 5 | 800 | 5.5 | 70 | 7.4133 | 7.6002 | 24 |
| Example 11 | | 0.30 | — | 5 | 800 | 5.5 | 70 | 7.4118 | 7.6082 | 24 |
| Example 12 | | 0.33 | — | 5 | 550 | 9.0 | 70 | 7.4068 | 7.6190 | 24 |
| Example 13 | $Rb_2CO_3$ and $H_2WO_3$ | — | 0.33 | 5 | 800 | 5.5 | 70 | 7.3898 | 7.5633 | 24 |
| Example 14 | $Cs_2CO_3$, | 0.03 | 0.3 | 5 | 800 | 5.5 | 70 | 7.3928 | 7.5730 | 24 |
| Example 15 | $Rb_2CO_3$ and | 0.20 | 0.13 | 5 | 800 | 5.5 | 70 | 7.4026 | 7.6035 | 24 |
| Example 16 | $H_2WO_4$ | 0.25 | 0.08 | 5 | 800 | 5.5 | 70 | 7.4049 | 7.6083 | 24 |
| Example 17 | | 0.30 | 0.03 | 5 | 800 | 5.5 | 70 | 7.4061 | 7.6087 | 24 |
| Example 18 | $Cs_2CO_3$ and $H_2WO_4$ | 0.33 | — | 5 | 800 | 5.5 | 70 | 7.4071 | 7.6188 | 24 |

TABLE 2

| | Optical properties | | | | |
|---|---|---|---|---|---|
| | MWO average particle size * [nm] | Visible light transmittance [%] | Solar radiation transmittance [%] | Transmittance @ 1000 nm [%] | Haze [%] |
| Example 1 | 25 | 69.8 | 35.9 | 5 | 0.9 |
| Example 2 | 25 | 70.0 | 36.3 | 5 | 0.9 |
| Example 3 | 24 | 70.3 | 35.7 | 5 | 0.9 |
| Example 4 | 25 | 70.2 | 35.8 | 5 | 0.9 |
| Example 5 | 24 | 70.3 | 36.1 | 5 | 0.9 |
| Example 6 | 25 | 66.7 | 34.1 | 5 | 1.0 |
| Example 7 | 25 | 67.0 | 34.1 | 5 | 1.0 |
| Example 8 | 25 | 67.1 | 33.9 | 5 | 1.0 |
| Example 9 | 25 | 68.3 | 35.5 | 5 | 1.0 |
| Example 10 | 25 | 68.2 | 34.9 | 5 | 0.9 |
| Example 11 | 25 | 68.4 | 34.3 | 5 | 0.9 |
| Example 12 | 25 | 70.0 | 35.8 | 5 | 0.9 |
| Example 13 | 24 | 70.0 | 34.7 | 5 | 1.2 |
| Example 14 | 25 | 70.0 | 34.9 | 5 | 1.1 |
| Example 15 | 25 | 69.9 | 35.1 | 5 | 1.1 |
| Example 16 | 25 | 70.1 | 35.3 | 5 | 1.1 |
| Example 17 | 25 | 70.0 | 35.7 | 5 | 1.1 |
| Example 18 | 25 | 62.1 | 28.5 | 1 | 1.3 |

MOW average particle size * average particle size of composite tungsten oxide fine particles in LTHC layer

TABLE 3

| | Raw Material | | Firing condition | | | Composite tungsten oxide fine particles | | | |
| | | | Atmosphere | | | | | | |
| | | | H₂ | | | Dispersed | Lattice constant | | Crystallite |
| | | Molar ratio | concentration | Temperature | Time | particle size | a-axis | c-axis | size |
| | Compound | Cs/W Rb/W | [%] | [° C.] | [h] | [nm] | [Å] | [Å] | [nm] |
|---|---|---|---|---|---|---|---|---|---|
| Comparative Example 1 | Cs₂CO₃ and H₂WO₄ | 0.11 — | 5 | 800 | 5.5 | 70 | 7.4189 | 7.5825 | 24 |
| Comparative Example 2 | | 0.15 — | 5 | 800 | 5.5 | 70 | 7.4188 | 7.5826 | 24 |
| Comparative Example 3 | | 0.39 — | 5 | 800 | 5.5 | 70 | 7.4025 | 7.6250 | 24 |
| Comparative Example 4 | | 0.21 — | 5 | 400 | 5.5 | 70 | 7.4198 | 7.5722 | 24 |
| Comparative Example 5 | | 0.23 — | 5 | 400 | 5.5 | 70 | 7.4192 | 7.5729 | 24 |
| Comparative Example 6 | | 0.33 — | 5 | 800 | 5.5 | 50 | 7.4095 | 7.6312 | 9 |
| Comparative Example 7 | | 0.33 — | 5 | 440 | 5.5 | 75 | 7.4072 | 7.6295 | 24 |
| Comparative Example 8 | | 0.33 — | 5 | 800 | 5.5 | 150 | 7.4076 | 7.6130 | 120 |
| Comparative Example 9 | | 0.33 — | 5 | 800 | 5.5 | 110 | 7.4092 | 4.6325 | 9 |
| Comparative Example 10 | — | — | — | — | — | — | — | — | — |

TABLE 4

| | Optical properties | | | | |
| | MWO average particle size * [nm] | Visible light transmittance [%] | Solar radiation transmittance [%] | Transmittance @ 1000 nm [%] | Haze [%] |
|---|---|---|---|---|---|
| Comparative Example 1 | 24 | 26.3 | 13.1 | 5 | 5.4 |
| Comparative Example 2 | 25 | 27.7 | 13.2 | 5 | 5.2 |
| Comparative Example 3 | 24 | 28.8 | 12.9 | 5 | 4.8 |
| Comparative Example 4 | 24 | 24.0 | 13.0 | 5 | 5.6 |
| Comparative Example 5 | 25 | 23.2 | 13.0 | 5 | 4.9 |
| Comparative Example 6 | 9 | 27.5 | 13.2 | 5 | 5.5 |
| Comparative Example 7 | 25 | 28.2 | 12.8 | 5 | 5.1 |
| Comparative Example 8 | 120 | 17.1 | 13.0 | 5 | 12.3 |
| Comparative Example 9 | 41 | 24.5 | 13.1 | 5 | 2.5 |
| Comparative Example 10 | 17* | 2.0 | 9.0 | 13 | 98.2 |

MOW average particle size * average particle size of composite tungsten oxide fine particles in LTHC layer
17* average particle size of the carbon black particle in LTHC layer

CONCLUSION

As is obvious from Tables 1 to 4, the LTHC layers produced from the composite tungsten oxide fine particles according to Examples 1 to 17 exhibit excellent infrared absorption properties as compared with the composite tungsten oxide fine particles of Comparative Examples 1 to 10.

Further, the composite tungsten oxide fine particles contained in the dispersion liquid according to Examples 1 to 17 were the composite tungsten oxide fine particles having the lattice constant such that the a-axis was 7.3850 Å or more and 7.4186 Å or less, and the c-axis was 7.5600 Å or more and 7.6240 Å or less, and the particle size of 100 nm or less. Furthermore, in the examples, since the average particle size and the crystallite size of the composite tungsten oxide fine particles in the LTHC layer are substantially the same, it is considered that the composite tungsten oxide fine particles are single crystals. On the other hand, Comparative Examples 1 to 10 were out of the lattice constant range or the particle size range described above.

In the donor sheet produced in each example, the condition of the transfer layer was able to be verified by visual observation from the film base material side. In comparative examples, however, the transparency of the LTHC layer was not enough to verify the condition of the transfer layer by visual observation.

DESCRIPTION OF SIGNS AND NUMERALS

1 Thermal plasma
2 High-frequency coil
3 Sheath gas feeding nozzle
4 Plasma gas feeding nozzle
5 Raw material powder feeding nozzle
6 Reaction vessel
7 Suction tube
8 Filter
11 Octahedron formed of $WO_6$ units
12 M element
20 Donor sheet
21 Film base material
22 Light to heat conversion layer
23 Transfer layer
221 Infrared absorbing particles

What is claimed is:

1. A light to heat conversion layer, comprising infrared absorbing particles and a binder component;
    wherein the infrared absorbing particles are composite tungsten oxide fine particles including a hexagonal crystal structure,
    the composite tungsten oxide fine particles are represented by general formula MxWyOz in which M is one or more elements selected from alkali metals, W is tungsten, O is oxygen, and x, y, and z satisfy $0.001 \leq x/y \leq 1$ and $2.0 \leq z/y \leq 3.0$,
    a lattice constant of the composite tungsten oxide fine particles is such that a-axis is 7.3850 Å or more and 7.4186 Å or less, and c-axis is 7.5600 Å or more and 7.6240 Å or less,
    a particle size of the composite tungsten oxide fine particles is 10 nm or more and 100 nm or less,
    a crystallite size of the composite tungsten oxide fine particles is 10 nm or more and 100 nm or less,
    a light transmittance at a wavelength of 1,000 nm of the light to heat conversion layer is 1% or more and 5% or less, and a visible light transmittance of the light to heat conversion layer is 62.1% or more and 70.3% or less.

2. The light to heat conversion layer according to claim 1, wherein the lattice constant of the composite tungsten oxide fine particles is such that the a-axis is 7.4031 Å or more and 7.4111 Å or less, and the c-axis is 7.5891 Å or more and 7.6240 Å or less.

3. The light to heat conversion layer according to claim 1, wherein M is one or more of Cs and Rb.

4. The light to heat conversion layer according to claim 1, wherein the thickness of the light to heat conversion layer is 5 μm or less.

5. The light to heat conversion layer according to claim 1, which is a dried and cured ink coated on a base material and contains the infrared absorbing particles and the binder component.

6. A light to heat conversion layer, comprising infrared absorbing particles and a binder component;
    wherein the infrared absorbing particles are composite tungsten oxide fine particles including a hexagonal crystal structure,
    the composite tungsten oxide fine particles are represented by general formula MxWyOz in which M is one or more elements selected from alkali metals, W is tungsten, O is oxygen, and x, y, and z satisfy $0.001 \leq x/y \leq 1$ and $2.0 \leq z/y \leq 3.0$,
    a lattice constant of the composite tungsten oxide fine particles is such that a-axis is 7.3850 Å or more and 7.4186 Å or less, and c-axis is 7.5600 Å or more and 7.6240 Å or less,
    a particle size of the composite tungsten oxide fine particles is 10 nm or more and 100 nm or less,
    a crystallite size of the composite tungsten oxide fine particles is 10 nm or more and 100 nm or less, and
    at least a part of a surface of the composite tungsten oxide fine particles is covered with a surface covering layer containing one or more elements selected from the group consisting of Si, Ti, Zr, and Al.

7. The light to heat conversion layer according to claim 6, wherein the surface covering layer contains oxygen atoms.

8. A donor sheet, comprising:
    the light to heat conversion layer of claim 1,
    a film base material, and
    a transfer layer.

9. A method for producing a light to heat conversion layer comprising infrared absorbing particles and a binder component,
    wherein the infrared absorbing particles are composite tungsten oxide fine particles including a hexagonal crystal structure and are represented by general formula MxWyOz in which M is one or more elements selected from alkali metals, W is tungsten, O is oxygen, and x, y, and z satisfy $0.001 \leq x/y \leq 1$ and $2.0 \leq z/y \leq 3.0$, and wherein a light transmittance at a wavelength of 1,000 nm of the light to heat conversion layer is 1% or more and 5% or less, and a visible light transmittance of the light to heat conversion layer is 62.1% or more and 70.3% or less,
    the method comprising:
        producing the composite tungsten oxide fine particles so that their lattice constant is in a range of 7.3850 Å or more and 7.4186 Å or less for a-axis, and 7.5600 Å or more and 7.6240 Å or less for c-axis, a particle size of the composite tungsten oxide fine particles is 10 nm or more and 100 nm or less, and a crystallite size of the composite tungsten oxide fine particles is 10 nm or more and 100 nm or less; and
        performing a pulverization and dispersion step so that an average particle size is 100 nm or less while maintaining the range of the lattice constant in the composite tungsten oxide fine particles.

10. The method for producing the light to heat conversion layer according to claim 9,
    wherein the M element is an element of one or more kinds selected from Cs and Rb.

11. The method for producing the light to heat conversion layer according to claim 9,
    wherein at least a part of a surface of the composite tungsten oxide fine particle is covered with a surface covering layer containing at least one or more kinds of elements selected from Si, Ti, Zr, and Al.

12. The method for producing the light to heat conversion layer according to claim 11,
    wherein the surface covering layer contains oxygen atoms.

13. The method for producing the light to heat conversion layer according to claim 9,
wherein the thickness of the light to heat conversion layer is 5 μm or less.

* * * * *